US008279957B2

(12) United States Patent
Tsai et al.

(10) Patent No.: US 8,279,957 B2
(45) Date of Patent: Oct. 2, 2012

(54) COMMUNICATION METHODS AND SYSTEMS HAVING PERMUTATION SCHEMES

(75) Inventors: Chia-Lung Tsai, Hsinchu (TW); Yu-Tao Hsieh, Hsinchu (TW); Jen-Yuan Hsu, Jincheng Township (TW); Pang-An Ting, Fongyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 441 days.

(21) Appl. No.: 12/579,653

(22) Filed: Oct. 15, 2009

(65) Prior Publication Data

US 2010/0111210 A1    May 6, 2010

Related U.S. Application Data

(63) Continuation-in-part of application No. 12/503,584, filed on Jul. 15, 2009.

(60) Provisional application No. 61/110,134, filed on Oct. 31, 2008, provisional application No. 61/159,524, filed on Mar. 12, 2009.

(51) Int. Cl.
*H04L 27/28* (2006.01)
(52) U.S. Cl. ......... 375/260; 375/259; 375/340; 375/295
(58) Field of Classification Search .................. 375/259, 375/260, 295, 340; 370/328, 329; 714/748
See application file for complete search history.

(56) References Cited

U.S. PATENT DOCUMENTS

| 2010/0008432 A1* | 1/2010 | Kim et al. ..................... | 375/260 |
|---|---|---|---|
| 2010/0074347 A1* | 3/2010 | Lomnitz et al. ............... | 375/260 |
| 2010/0111014 A1* | 5/2010 | Kang et al. ..................... | 370/329 |
| 2010/0165935 A1* | 7/2010 | Cho et al. ........................ | 370/329 |
| 2011/0002309 A1* | 1/2011 | Park et al. ..................... | 370/335 |
| 2011/0055652 A1* | 3/2011 | Park .............................. | 714/748 |

OTHER PUBLICATIONS

Fwu, Jong-Kae (JK), et al., "Proposed Text of DL Physical Layer Section for the IEEE 802.16m Amendment", IEEE 802.16 Broadband Wireless Access Working Group, IEEE C802.16m-08/1443r2, Nov. 3, 2008.
Lomnitz, Yuval, et al., "Symbol structure design for 802.16m—resource blocks and pilots", IEEE 802.16 Broadband Wireless Access Working Group, IEEE C802.16m-08/121, Mar. 10, 2008.

* cited by examiner

*Primary Examiner* — Shuwang Liu
*Assistant Examiner* — Helene Tayong
(74) *Attorney, Agent, or Firm* — Finnegan, Henderson, Farabow, Garrett & Dunner, LLP

(57) ABSTRACT

A wireless communication method implemented in a communication system includes receiving a first data sequence, and processing the first data sequence to obtain information containing at least one of a first number and a sampling spacing associated with the first data sequence. The method also includes permuting the first data sequence to generate a permuted second data sequence. Permuting the first data sequence includes determining a first parameter based on at least one of the first number and the sampling spacing, determining a second parameter based on at least one of the first parameter, the first number, and the sampling spacing, and determining a mapping relationship between a j-th data item of the permuted second data sequence and an i-th data item of the first data sequence. The method further includes outputting the permuted second data sequence.

24 Claims, 9 Drawing Sheets

COMMUNICATION METHODS AND SYSTEMS HAVING PERMUTATION SCHEMES

PRIORITY

This application is a continuation-in-part of co-pending U.S. patent application Ser. No. 12/503,584, filed Jul. 15, 2009, which claims the benefit of U.S. Provisional Patent Applications Nos. 61/110,134, filed Oct. 31, 2008, and 61/159,524, filed Mar. 12, 2009, the entire contents of all of which are incorporated herein by reference.

TECHNICAL FIELD

The present disclosure relates generally to communication methods and systems and, more particularly, to communication methods and systems having permutation schemes.

BACKGROUND

In modern communication systems, signals may be transmitted from a source location to a destination location in analog or digital forms. As an example, the use of digital data communication may increase capacity of data transmission, flexibility of data manipulation, etc. Signals containing data, such as data derived from test, image, voice, video, etc., may be encoded into sequences of symbols or binary symbols, which are then transmitted from a transmitter to a receiver through one or more communication channels, such as via a cable or over-the-air.

In digital communication systems, data can be transmitted through one or more frequency bands within a finite frequency bandwidth. When multiple channels are used, these channels may overlap one another, and interferences may occur between the overlapped channels. One method to reduce or eliminate the interferences is to utilize orthogonal frequency division multiplexing (OFDM). In an OFDM system, a single channel may include multiple subcarriers having different but adjacent frequency bands. Although these subcarriers may overlap one another, they are orthogonal to one another, thereby reducing or eliminating the interferences caused by frequency overlap.

Examples of OFDM communication systems include systems complying with IEEE 802.16e or 802.16m standards. One version of such standards includes a proposal to IEEE C802.16m-08/1443 standard, titled "Proposed Text of DL Physical Layer Section for the IEEE 802.16m Amendment" ("Reference 1"). In a system consistent with Reference 1, permutation is utilized to increase the diversity of a channel coding block by changing the location of data subcarriers. It is preferable to evenly permute the contiguous data subcarriers in physical frequency to prevent a forward error correction (FEC) block from bursting errors. The forward error correction block is used to correct errors in the data stream as long as the number of the errors is under control. However, when there are too many errors in the FEC block, the FEC block can no longer be used to correct the errors. By applying permutation, the burst errors in frequency or time domain can be distributed to several FEC blocks so that each block can be used to correct errors. In the proposal to IEEE 802.16m standard, i.e., Reference 1, a large table of permutation sequences is relied upon to obtain the results of random distribution. However, this method may require a large number of additional memories or other storage devices for storing the large permutation sequence table, which may lead to increased hardware complexity and degraded system performance in certain applications.

Therefore, it may be desirable to have alternative communication systems and methods having alternative permutation schemes.

SUMMARY

In one exemplary embodiment, the present disclosure is directed to a wireless communication method implemented in a communication system. The method includes receiving a first data sequence at a data receiving interface of the communication system, the first data sequence having a first number of data items. The method also includes processing the first data sequence by a data processing device of the communication system, the first data sequence being processed to obtain information associated with the first data sequence, the information containing at least one of the first number and a sampling spacing. The method also includes permuting the first data sequence by a data permutation device of the communication system to generate a permuted second data sequence. Permuting the first data sequence includes determining a first parameter based on at least one of the first number and the sampling spacing, determining a second parameter based on at least one of the first parameter, the first number, and the sampling spacing, and determining a mapping relationship between a j-th data item of the permuted second data sequence and an i-th data item of the first data sequence based on at least one of the index j, the first parameter, and the second parameter, indexes i and j being integers. The method further includes outputting the permuted second data sequence through an output interface of the communication system.

In another exemplary embodiment, the present disclosure is directed to a wireless communication method implemented in a communication system. The method includes receiving a first data sequence to be permuted, and identifying at least a length of the first data sequence and a sampling spacing for permutation. The method also includes determining a mapping relationship between the first data sequence and a second data sequence that is generated by permuting the first data sequence. Determining the mapping relationship includes identifying an i-th data item from the first data sequence for a corresponding j-th position in the second data sequence based on the index j and at least one of the length of the first data sequence and the sampling spacing. The method further includes outputting the second data sequence for wireless communication.

In still another exemplary embodiment, the present disclosure is directed to a system for wireless communication. The system includes a data receiving interface configured to receive a first data sequence to be permuted, the first data sequence having a first number of data items, and a data processing device coupled with the data receiving interface and configured to apply a permutation to the first data sequence and generate a permuted second data sequence. The data processing device includes a permutation device configured to obtain information associated with the first data sequence, the information containing at least a sampling spacing. The permutation device is also configured to determine a first parameter based on at least one of the first number and the sampling spacing, determine a second parameter based on at least one of the first parameter, the first number, and the sampling spacing, and determine a mapping relationship between a j-th data item of the second data sequence and an i-th data item of the first data sequence based on at least one of the index j, the first parameter, and the second parameter, indexes i and j being integers. The system further includes an output interface coupled with the data processing device and configured to output the permuted second data sequence for wireless communication.

In still another exemplary embodiment, the present disclosure is directed to a wireless communication method implemented in a communication system. The method includes receiving a first data sequence at a data receiving interface of the communication system, the first data sequence having a first number of data items. The method also includes processing the first data sequence by a data processing device of the communication system to obtain information associated with the first data sequence, the information containing at least one of the first number, a second number, and a sampling spacing, the second number being determined based on the first number. The method also includes permuting the first data sequence by a data permutation device of the communication system to generate a permuted second data sequence. Permuting the first data sequence includes determining a first parameter based on at least one of the second number and the sampling spacing, determining a second parameter based on at least one of the first parameter, the second number, and the sampling spacing, and determining a mapping relationship between a j-th data item of the permuted second data sequence and an i-th data item of the first data sequence based on at least one of the index j, the first parameter, and the second parameter, indexes i and j being integers. The method further includes outputting the permuted second data sequence through an output interface of the communication system.

DETAILED DESCRIPTION

Figure 1:
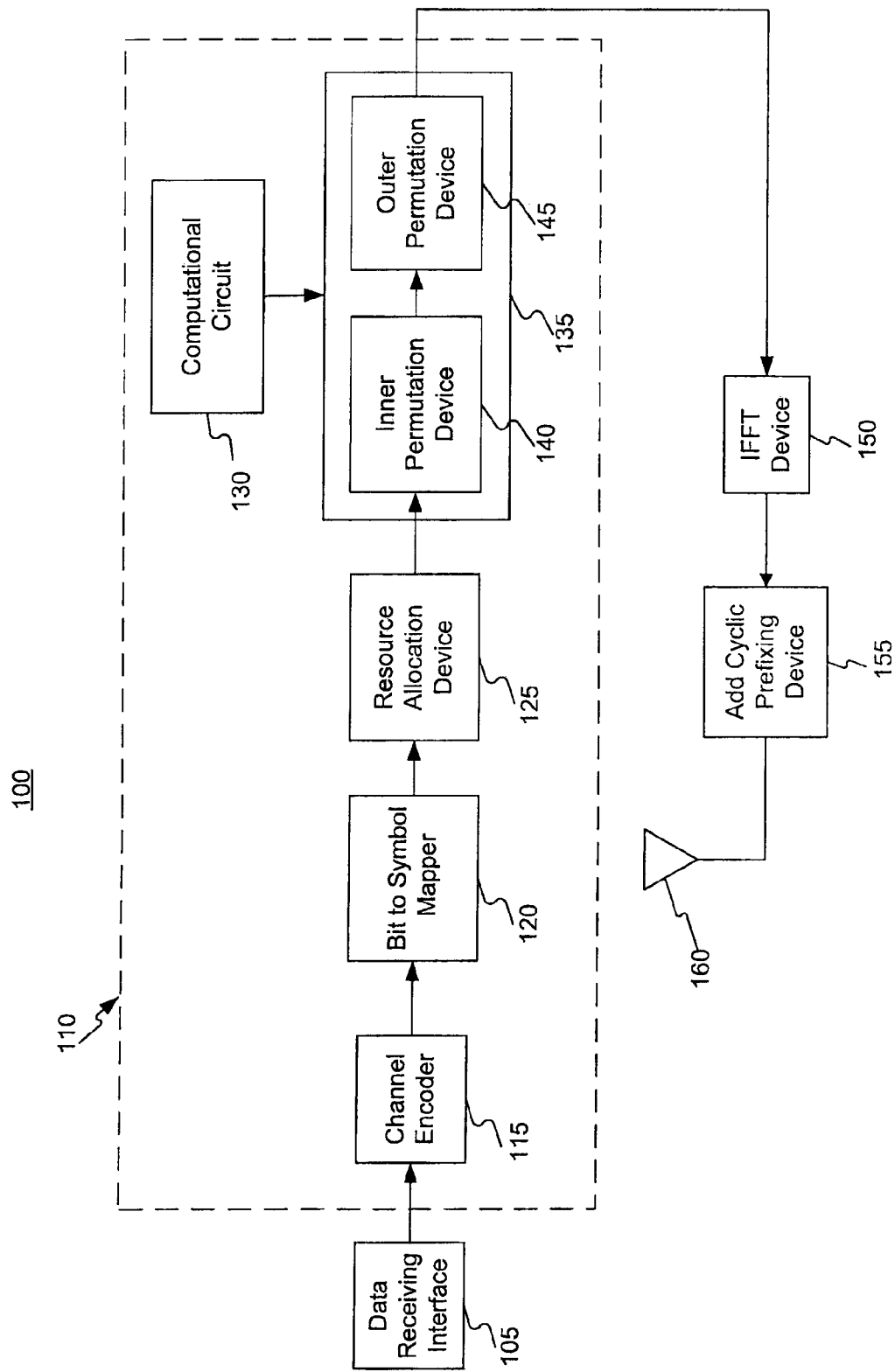
FIG. 1 illustrates a schematic block diagram of an exemplary system for wireless communication consistent with the disclosed embodiments.

FIG. 1 schematically illustrates an exemplary system 100 consistent with the disclosed embodiments. The system 100 may be a part of a wireless communication system, for example, a coded OFDM communication system at a transmitter side. The system 100 may include a data receiving interface 105 configured to receive an input of a data stream, which may include at least one data sequence having, for example, uncoded data bits. The system 100 may include a data processing device 110 configured to process the data stream, for example, by applying a coding scheme, such as a turbo coding and/or a permutation to the data stream. In one embodiment, the data processing device 110 may include a channel encoder 115, a bit to symbol mapper 120, and a resource allocation device 125. The channel encoder 115 may receive the input data stream including uncoded data bits, and may encode the data stream using any suitable techniques, such as, for example, convolutional turbo coding. Coded data bits may then be mapped into data symbols of a predetermined length by the bit-to-symbol mapper 120. The resource allocation device 125 may be configured to distribute the data symbols onto one or more subcarrier frequencies in frequency domain, and may form a number of logical resource units (LRUs). Each LRU may be in form of an $N_F$ by $N_T$ matrix, where $N_F$ and $N_T$ may be integer numbers, with $N_F$ indicating the number of subcarrier frequencies, and $N_T$ indicating the number of symbols. Each row of the LRU may correspond to a subcarrier frequency, and each column of the LRU may correspond to a symbol or a time index. As a result, each small block of the $N_F$ by $N_T$ matrix in the LRU may correspond to a subcarrier, which further corresponds to a combination of a subcarrier frequency and a time index. Thus, each LRU may include $N_F$ by $N_T$ subcarriers.

In one embodiment, the data processing device 110 may also include a computational circuit 130 configured to compute a permutation sequence based on a content of the at least one data sequence of the data stream. The computed permutation sequence may be a non-predetermined sequence. In other words, the permutation sequence may be computed based on the data sequence to be permuted and may not be retrieved from a lookup table, for example, that contains predetermined permutation sequences. The data processing device 110 may also include a data permutation device 135 configured to apply a permutation to the data stream based on the permutation sequence computed by the computational circuit 130. In one embodiment, the data permutation device 135 may include an inner permutation device 140, or an outer permutation device 145, or both. Each of the inner and outer permutation devices 140 and 145 may be configured to permute the data stream based on computed permutation sequences. For example, the inner permutation device 140 may be configured to perform an inner permutation on the data stream at the subcarrier level by permuting the subcarriers, whereas the outer permutation device 145 may be configured to perform an outer permutation on the data stream at the resource unit level by permuting the resource units.

As shown in FIG. 1, the data stream may be first permuted by the inner permutation device 140 and then be permuted by the outer permutation device 145. The data stream may also be first permuted by the outer permutation device 145 and then be permuted by the inner permutation device 140. The data permutation device 135 may include separate inner and outer permutation devices 140 and 145, as shown in FIG. 1, or alternatively, may include a single permutation module configured to perform both the inner and outer permutations.

A plurality of physical resource units (PRUs) may be formed after the logical resource units are permuted by the data permutation device 135. The permuted data stream including the physical resource units may be further processed by an Inverse Fast Fourier Transformation (IFFT) device 150, which may apply a suitable inverse Fast Fourier Transformation algorithm to the permuted data stream. The system 100 may also include an Add Cyclic Prefixing device 155, which may add a cyclic prefixing to the permuted data stream based on a predetermined algorithm. In one embodiment, the IFFT device 150 and the Add Cyclic Prefixing device 155 may also be included in the data processing device 110. The system 100 may also include an output interface 160. The output interface 160 may be coupled with the data processing device 110, and may be, for example, a wireless communication antenna. The output interface 160 may be configured to output the permuted data stream for wireless transmission. The system 100 may include a greater or lesser number of components. For example, in one embodiment, the data processing device may include one or more processors configured to process the data stream.

Figure 2:
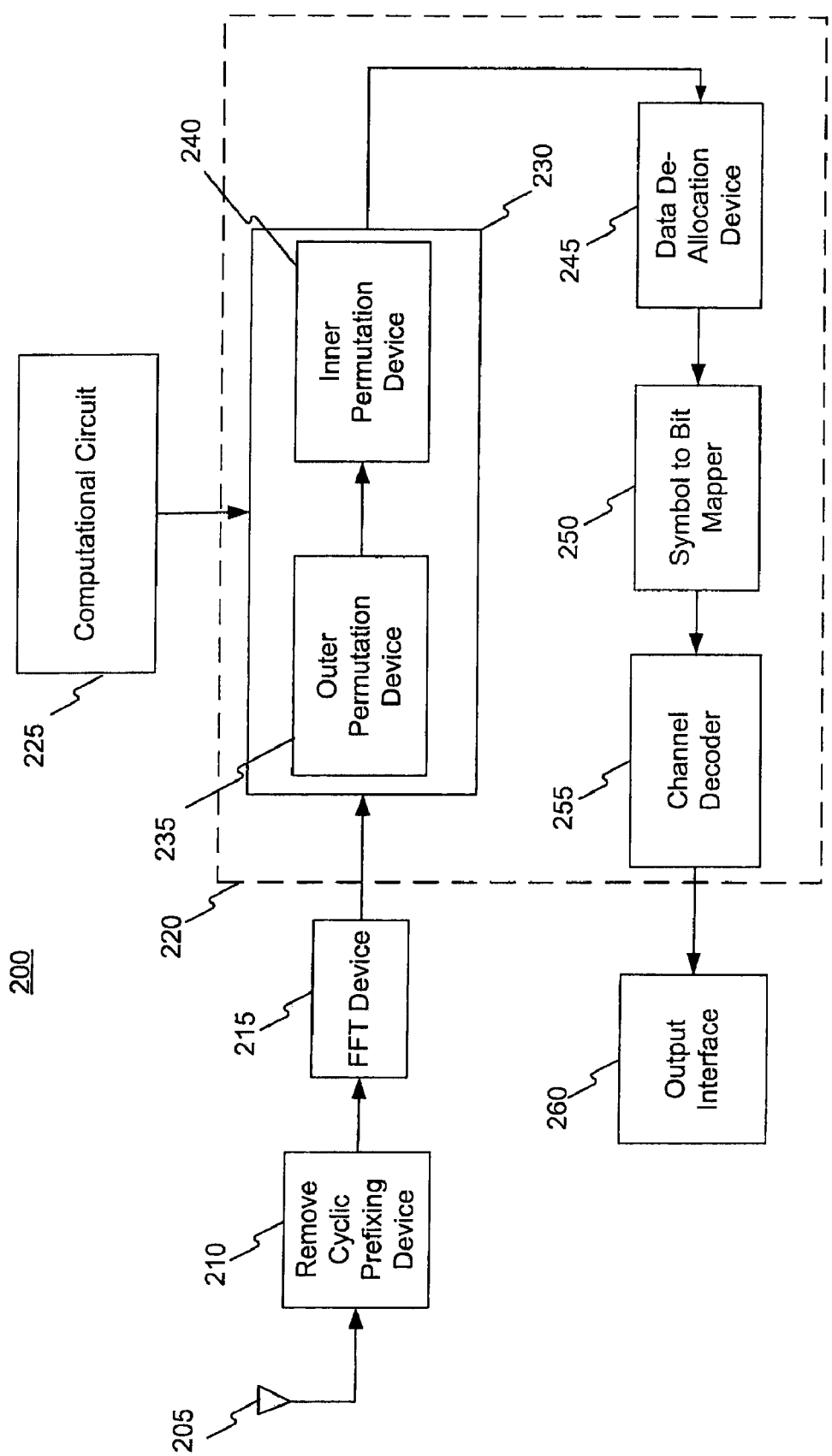
FIG. 2 illustrates a schematic block diagram of an exemplary system for wireless communication consistent with the disclosed embodiments.

FIG. 2 schematically illustrates an exemplary system 200 consistent with the disclosed embodiments. The system 200 may be at least a part of a wireless communication system, for example, a coded OFDM communication system at the receiver side. The system 200 may include a data receiving interface 205, such as, for example, an antenna configured to receive a signal containing a data stream. The data stream may be the data stream transmitted from the system 100 on the transmitter side, and may contain at least one data sequence.

The system 200 may include a Remove Cyclic Prefixing device 210 configured to remove a cyclic prefixing, which may have been added to the data stream by the Add Cyclic Prefixing device 155 on the transmitter side. The system 200 may include a Fast Fourier Transformation device 215, which may be located downstream of the Remove Cyclic Prefixing device 210. The Fast Fourier Transformation device 215 may be configured to apply a suitable Fast Fourier transformation to the data stream. The system 200 may include a data processing device 220. The decoding device 220 may include a plurality of devices, such as, for example, a computational circuit 225, a data permutation device 230, a data de-allocation device 245, a symbol to bit mapper 250, and a channel decoder 255. In one embodiment, the data processing device 220 may also include the Fast Fourier Transformation device 215 and the Remove Cyclic Prefixing device 210.

The data processing device 220 may be configured to process the data stream by, for example, applying one or more coding or decoding processes to the data stream, and/or one or more permutations to the data stream. A decoding process may also be referred to as a coding process in a reversed direction. The computational circuit 225 may be similar to the computational circuit 130 shown in FIG. 1. The computational circuit 225 may be configured to compute permutation sequences based on a content of the at least one data sequence of the data stream. The computed permutation sequence may be a non-predetermined sequence. In other words, the permutation sequence may be computed by the computational circuit 225 based on a content of the data sequence to be permuted, and may not be retrieved from a lookup table that contains predetermined permutation sequences. The data permutation device 230 may perform permutations, such as inner and/or outer permutations on the data stream based on the permutation sequences computed by the computational circuit 225. The data permutation device 230 may include an outer permutation device 235 and/or an inner permutation device 240.

The outer permutation device 235 may be similar to the outer permutation device 145 of FIG. 1 on the transmitter side, and may be configured to apply an outer permutation to the data stream. The inner permutation device 240 may be similar to the inner permutation device 140 or FIG. 1 on the transmitter side, and may be configured to apply an inner permutation to the data stream. Alternatively, the outer permutation device 235 and the inner permutation device 240 may also be different from the outer permutation device 145 and the inner permutation device 140, respectively. The outer permutation device 235 and the inner permutation device 240 may each apply an inverse operation of permutation to the data stream that has already been permuted by the outer permutation device 145 and the inner permutation device 140.

Still referring to FIG. 2, after the data stream is processed by the outer permutation device 235 and/or the inner permutation device 240, the data stream may be further processed by the data de-allocation device 245. The data de-allocation device 245 may perform an inverse operation of the process performed by the resource allocation device 125. Specifically, the data de-allocation device 245 may de-allocate or separate, in each resource unit, data symbols from subcarrier frequencies, to which the data symbols have already been allocated, for example, by the resource allocation device 125.

The data symbols may be further de-mapped into data bits through the symbol to bit mapper 250, and decoded through the channel decoder 255. For example, the channel decoder 255 may apply a suitable algorithm to remove a coding, such as a turbo code that has been applied to the data stream by the channel encoder 115 on the transmitter side, thereby decoding the data stream. The operation performed by the channel decoder 255 may be inverse to the operation performed by the channel encoder 115. The data stream containing decoded data bits may be output through an output interface 260 for wireless transmission. The output interface 260 may include an antenna or other types of interfaces used for output signals or data.

Figure 3:
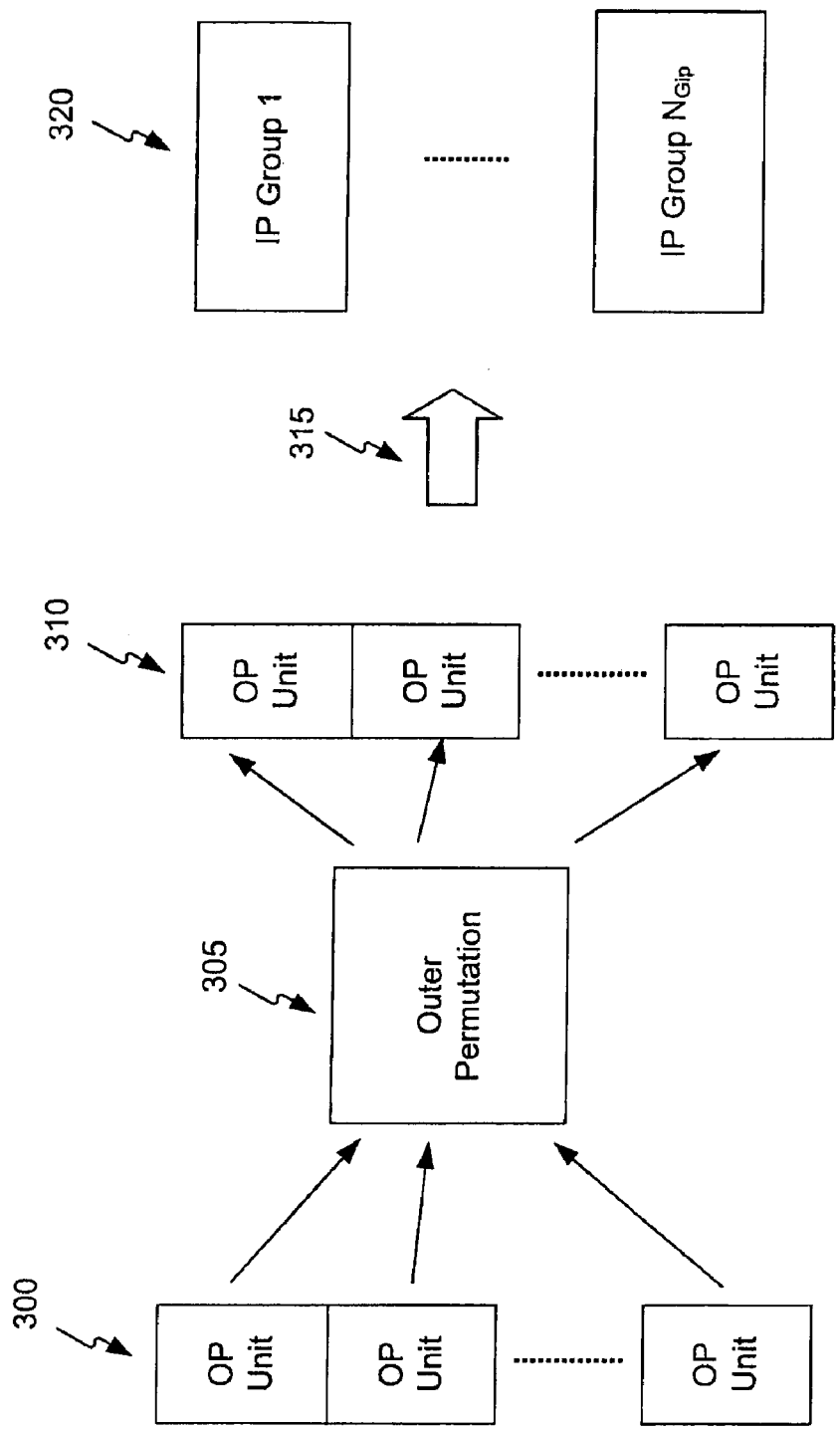
FIG. 3 is a diagrammatic illustration of an outer permutation operation consistent with the disclosed embodiments.

FIG. 3 illustrates a schematic diagram of an exemplary outer permutation consistent with the disclosed embodiments, which may be performed by an outer permutation device, for example, the outer permutation device 235 of system 200 on the receiver side of a communication system. Alternatively, the outer permutation may also be performed by the outer permutation device 145 of system 100 on the transmitter side of the communication system. The outer permutation may be performed on a first data stream 300, which may contain a plurality of outer permutation units (OP units). Each outer permutation unit (OP unit) may include at least one physical resource unit (PRU). In one embodiment, each outer permutation unit may include a miniband. Each miniband may include one or more physical resource units.

An outer permutation 305 may be applied to the first data stream 300. The outer permutation 305 may be employed by the outer permutation device 235. An order of the outer permutation units may be rearranged based on an outer permutation sequence or an outer permutation algorithm. A second data stream 310 may be generated by the outer permutation 305. The second data stream 310 may include the same outer permutation units rearranged in an order different from the order of the outer permutation units within the first data stream 300. Through a process 315, the second data stream 310 may be rearranged into a third data stream 320, which may be in a form different from the form of the second data stream 310. For example, the first and the second data streams 300 and 310 may be in a vector form, where the plurality of outer permutation units are arranged in a column. The third data stream 320 may be in a matrix form, where the plurality of outer permutation units from the second data stream 310, or a plurality of second data streams 310, may be rearranged as elements of the matrix form in the third data stream 320. In one embodiment, the third data stream 310 may include a plurality of inner permutation groups (e.g., IP group 1 to IP group $N_{Gip}$, where $N_{Gip}$ is an integer number) to be permuted by an inner permutation. The outer permutation may include a miniband permutation, where minibands may be permuted based on a permutation sequence. After the miniband permutation, the order of the minibands may be changed.

Figure 4:
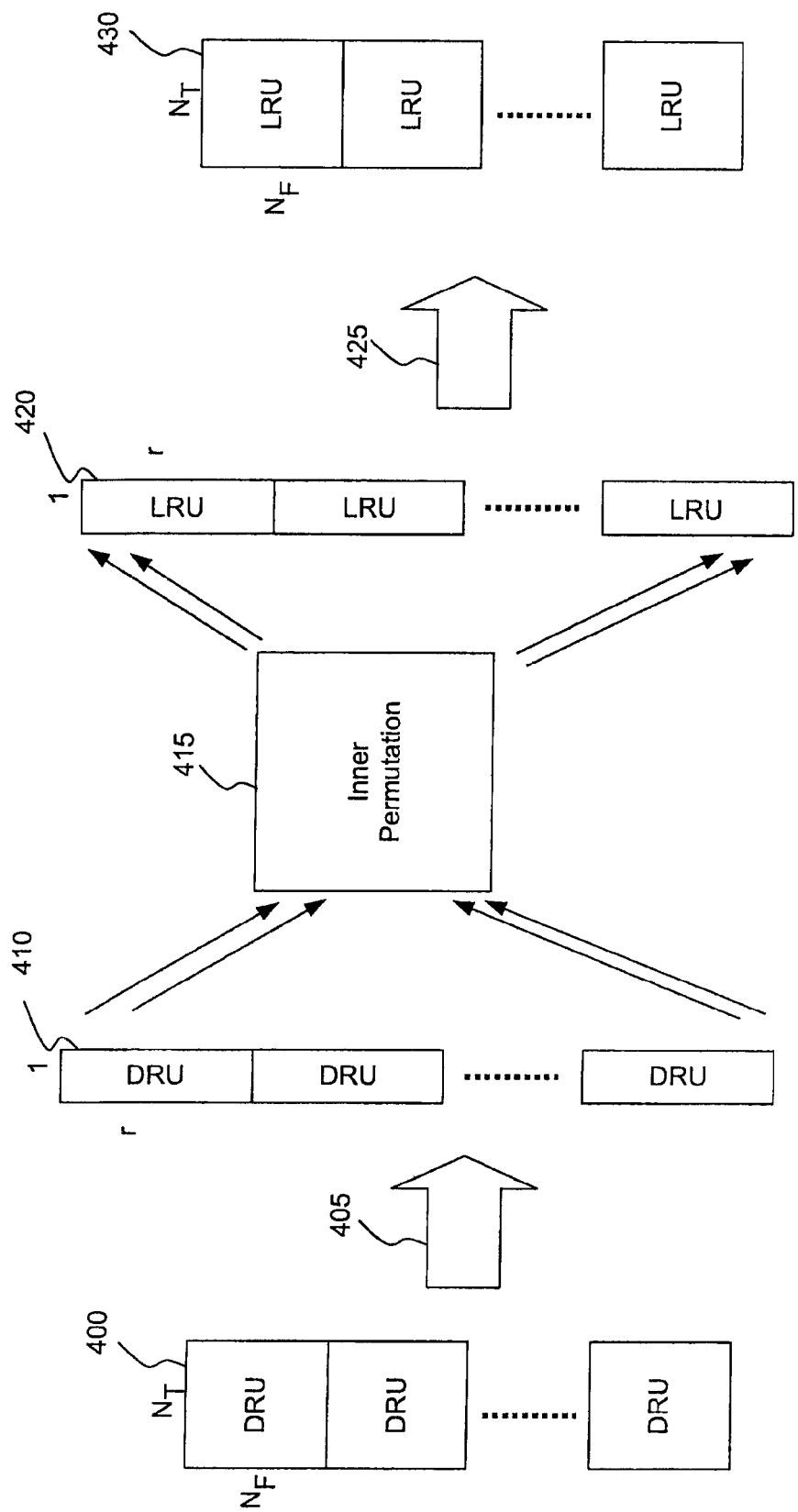
FIG. 4 is a diagrammatic illustration of an inner permutation operation consistent with the disclosed embodiments.

FIG. 4 schematically illustrates an exemplary inner permutation consistent with the disclosed embodiments. The inner permutation illustrated in FIG. 4 may be performed by the inner permutation device 240 of the system 200 on the receiver side, or the inner permutation device 140 of the system 100 on the transmitter side.

The inner permutation may be performed on a fourth data stream 400, which may include $N_{RU,ip}$ distributed resource units (DRUs), where $N_{RU,ip}$ may be an integer number. The fourth data stream 400 may be at least part of the third data stream 310 generated by the outer permutation 305 shown in FIG. 3. For example, the fourth data stream 400 may be one of the plurality of inner permutation groups (IP group 1 to IP group $N_{Gip}$), or may be a portion of all the plurality of inner permutation groups (IP group 1 to IP group $N_{Gip}$). The fourth data stream 400 may be arranged in a matrix form. The DRUs within the fourth data stream 400 may be associated with an index number, for example, from 0 to $N_{RU,ip}-1$. Each DRU may be in a matrix form, and may include $N_F$ by $N_T$ subcarriers, with $N_F$ frequencies associated with $N_T$ symbols. The fourth data stream 400 may include a total of $N_T*N_F*N_{RU,ip}$ subcarriers.

A process 405 may be applied to the fourth data stream 400 to pre-process the fourth data stream 400 before an inner permutation 415 is applied. The process 405 may re-arrange the fourth data stream 400 into a vector form, such as, for example, a column having r by 1 subcarriers, r being an integer number indicating a number of rows. In one embodiment, the entire fourth data stream 400 may be re-arranged into a fifth data stream 410 having a single column, with the row number r being $N_T*N_F*N_{RU,ip}$. In such an embodiment, each matrix DRU of the fourth data stream 400 may be re-arranged into a column of size $(N_F*N_T)$ by 1.

In one embodiment, the fourth data stream 400 may be re-arranged into a plurality of fifth data streams 410. For example, each fifth data stream 410 may be formed based on a column of the fourth data stream 400, or in other words, a symbol from the fourth data stream 400. In such an embodiment, the number of rows r may be $N_F*N_{RU,ip}$, and the fourth data stream 400 may be re-arranged into $N_T$ columns, each column forming one of the plurality of fifth data streams 410.

The inner permutation 415 may be applied to the fifth data stream 410, and may re-arrange the order of the subcarriers of the fifth data stream 410 based on an inner permutation sequence or an inner permutation algorithm. The fifth data stream 410 having a plurality of distributed resource units (DRUs), after being permuted by the inner permutation 415, may become a sixth data stream 420 having a plurality of logical resource units (LRUs). The sixth data stream 420 may be in a vector form, such as, for example, a column or a row. The sixth data stream 420 may include the same number of resource units as the fifth data stream 410, for example, r by 1. A process 425 may be applied to the sixth data stream 420 to generate a seventh data stream 430.

The seventh data stream 430 may be in a matrix form, and may include $N_{RU,ip}$ LRUs. Each LRU may be in a matrix form including $N_T*N_F$ subcarriers, with $N_T$ being a number of rows indicating a number of frequencies, and $N_F$ being a number of columns indicating a number of symbols. The seventh data stream 430 may be formed from the sixth data stream 420 or a plurality of sixth data streams 420.

The inner permutation 415 may be performed at the subcarrier level. That is, the inner permutation 415 may be performed by permuting the subcarriers of the fifth data stream 410 based on an inner permutation sequence.

The inner permutation sequence may be computed based on at least one of the following equations (1) and (2):

$$Sca_{output}(k,s) = N_{RU,ip}*n_k + \{P_s[n_k \bmod N_{RU,ip}] + \text{PermBase}\} \bmod N_{RU,ip} \quad (1)$$

$$P_0(j) = j+1, \text{ where, } j = 0, 1, \ldots, N_{RU,ip}-1. \quad (2)$$

In equation (1), $Sca_{output}(k,s)$ may stand for a permutation output index number in the resulting permuted data sequence generated by the inner permutaiton. s may stand for an index number of a resource unit among the total $N_{RU,ip}$ resource units (e.g., DRU or LRU) to be permuted. For example, s may be any integer number from 0 to $N_{RU,ip}-1$. $n_k$ may equal to $(k+13*s) \bmod N_{unit}$, where $N_{unit}$ may be the total number of subcarriers within a resource unit. $N_{unit}$ may be an integer number. k may stand for an index number of a subcarrier within a resource unit, and may be an integer number from 0 to $N_{unit}-1$. PermBase may be an integer number ranging from 0 to $N_{PermBase}-1$, where $N_{PermBase}$ may be an integer number associated with base stations of the communication system.

$P_0$ may be referred to as a basic inner permutation sequence. Sequence $P_s$ may be obtained by cyclically shifting the basic permutation sequence $P_0$ to the left by s times. Alternatively, sequence $P_s$ may be obtained by cyclically shifting the basic permutation sequence $P_0$ to the right by s times. The result of $(n_k \bmod N_{RU,ip})$ may be an index number for the data sequence $P_s$. For example, if s=0, $P_0=[1, 2, \ldots, N_{RU,ip}]$, then each element of $P_0$ is $P_0(1)=1$, $P_0(2)=2$, etc. If s=1, then $P_1$ may be obtained by cyclically shifting $P_0$ to the left by 1 time, thus, $P_1=[2, 3, \ldots, N_{RU,ip}, 1]$, and each element may be determined as $P_1[1]=2$, $P_1[2]=3$, etc.

The permutation sequences determined by equations (1) and (2) may be computed using a computational circuit. Permutation sequences generated by equations (1) and (2) may be utilized in an inner permutation on the receiver side of the communication system. In some embodiments, the permutation sequences generated by equations (1) and (2) may also be applied to an inner permutation on the transmitter side of the communication system.

Figure 5:
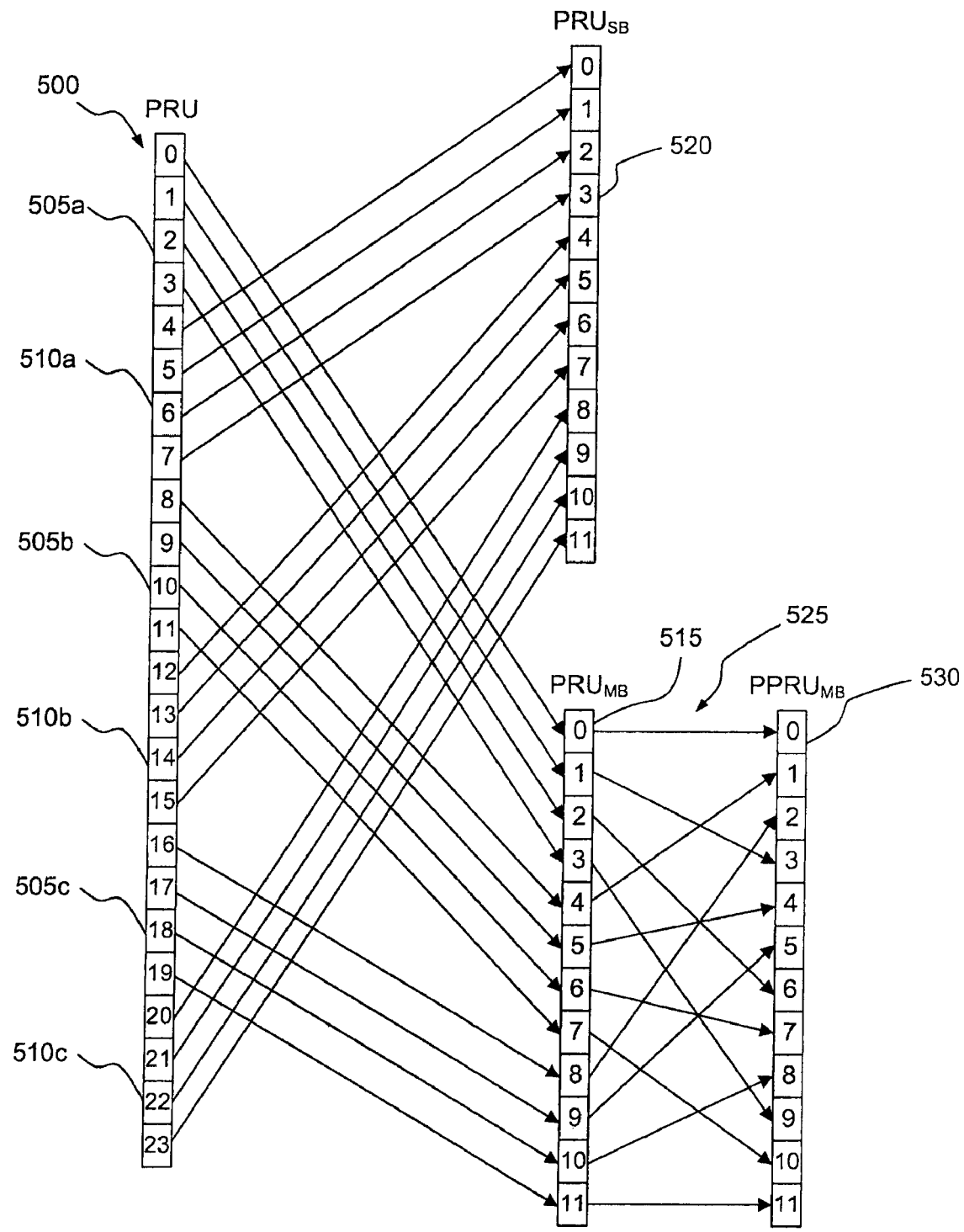
FIG. 5 is a diagrammatic illustration of a permutation operation consistent with the disclosed embodiments.

FIG. 5 is a diagrammatic illustration of a permutation process consistent with the disclosed embodiments. In FIG. 5, an eight data stream 500 may include a plurality of physical resource units (PRUs). The plurality of physical resource units may be divided into a first plurality of PRUs including, for example, PRU 505a, 505b, and 505c, and a second plurality of PRUs including, for example, PRU 510a, 510b, 510c. The first plurality of PRUs including 505a, 505b, and 505c may be used to form a ninth data stream 515, denoted as $PRU_{MB}$ 515, and having one or more minibands. The second plurality of PURs including 510a, 510b, and 510c may be used to form a tenth data stream 520, denoted as $PRU_{SB}$ 520, and having one or more subbands. Subbands may be used for allocation of PRUs to selective continguous frequencies. Minibands may be used for allocation of PRUs to diverse frequencies, which may increase the randomness of the PRU allocation and the error correcting capability of the communication system.

A subband may include $N_1$ PRUs, which may or may not be adjacent with one another. A miniband may include $N_2$ PRUs, which may or may not be adjacent with one another. $N_1$ and $N_2$ are integer numbers. In one embodiment, $N_1$ and $N_2$ may be constant values in the communication system, for example, $N_1=4$ and $N_2=1$. The total number of minibands in an allocation of PRUs may be denoted as $K_{MB}$, and the total number of PRUs allocated to minibands may be denoted as $L_{MB}$. Therefore, the relationship between $L_{MB}$ and $K_{MB}$ may be expressed as $L_{MB}=N_2*K_{MB}$ or equivalently as $K_{MB}=L_{MB}/N_2$. $L_{MB}$, which represents the total number of PRUs, may also indicate a length of the ninth data stream $PRU_{MB}$ 515. With the above relationship between $L_{MB}$ and $K_{MB}$, the total number of minibands, i.e., $K_{MB}$, may also indicate the length of the ninth data stream $PRU_{MB}$ 515.

A miniband permutation 525 may be applied to the ninth data stream $PRU_{MB}$ 515 based on a permutation sequence or algorithm. The total number of minibands included in the ninth data stream $PRU_{MB}$ 515 may be represented by $K_{MB}$, which may be calculated from the relationship $K_{MB}=L_{MB}/N_2$. An eleventh data stream $PPRU_{MB}$ 530 may be generated by the miniband permutation applied to the ninth data stream $PRU_{MB}$ 515. The miniband permutation 525 may be part of the outer permutation 305. The outer permutation may include two parts, the miniband permutation and a subband permutation, which is not discussed herein. The total number of data items in a data stream (or the length) generated by a permutation, e.g., the eleventh data stream $PPRU_{MB}$ 530, may be the same as the total number of data items of the data stream (or the length) that is permuted, e.g., the ninth data stream $PRU_{MB}$ 515.

Figure 6:
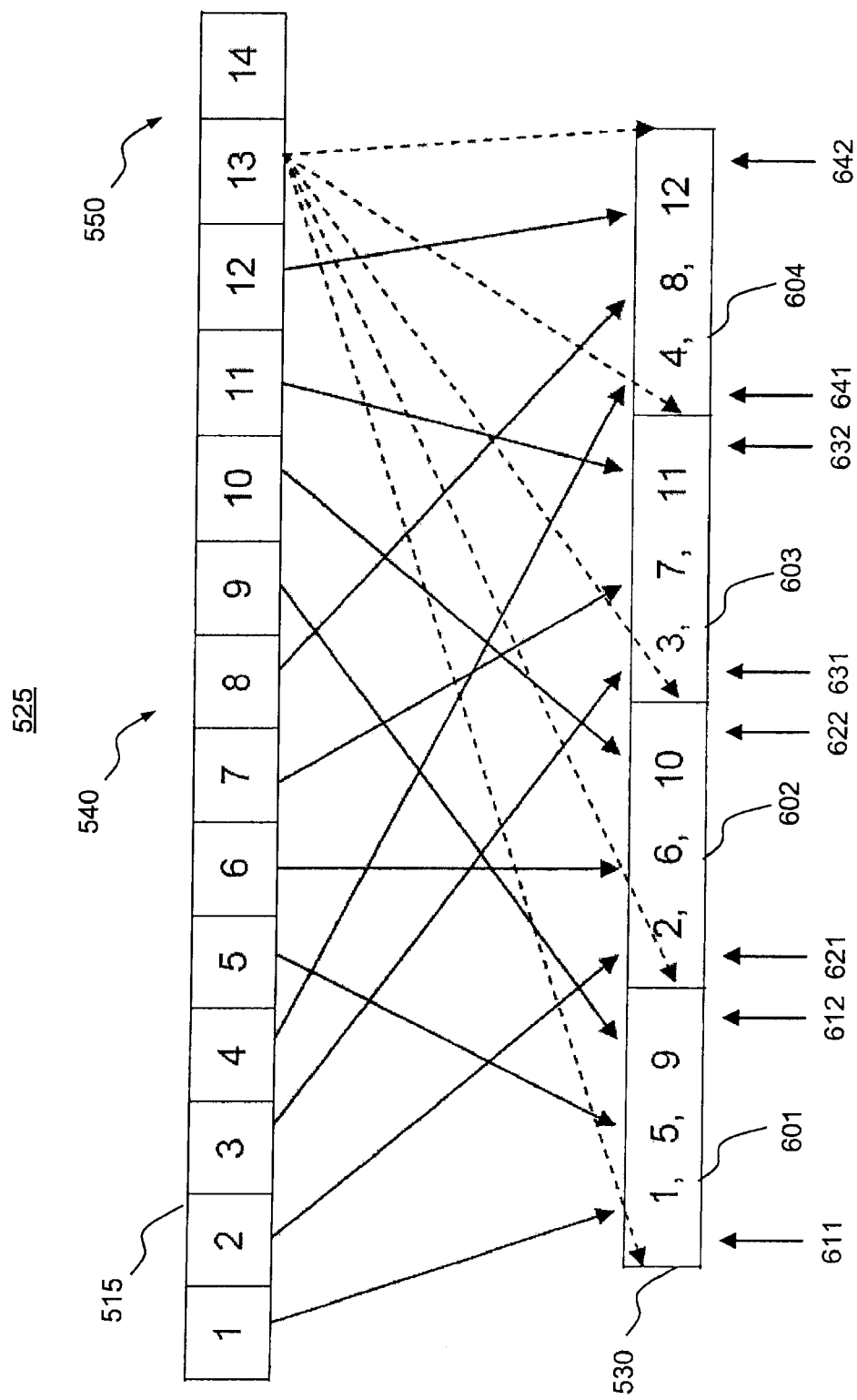
FIG. 6 is a schematic illustration of an exemplary miniband permutation operation consistent with the disclosed embodiments.

FIG. 6 illustrates an exemplary miniband permutation 525. An example of the ninth data stream $PRU_{MB}$ 515 is illustrated as [1, 2, 3, 4, 5, 6, 7, 8, 9, 10, 11, 12, 13, 14]. The numbers 1-14 may represent positions 1 to 14 within the ninth data stream $PRU_{MB}$ 515, and each position (e.g., positions 1, 2, . . . , 14) may represent an data item, such as, for example, a miniband. Therefore, the ninth data stream $PRU_{MB}$ 515 may contain 14 data items (e.g., minibands). Thus, $L_{MB}=14$, and $K_{MB}=L_{MB}=14$, assuming $N_2=1$. When the miniband permutation 525 is applied to the ninth data stream $PRU_{MB}$ 515, the ninth data stream $PRU_{MB}$ 515 may be transformed into the permuted eleventh data stream $PPRU_{MB}$ 530. The permuted eleventh data stream $PPRU_{MB}$ 530 may include the same number of data items as the ninth data stream $PRU_{MB}$ 515. The positions of the permuted eleventh data stream $PPRU_{MB}$ 530 may be virtually or actually divided into a plurality of sub-blocks. The number of sub-blocks may be predetermined based on the length of the data sequence and a sampling spacing. The permuted eleventh data stream $PPRU_{MB}$ 530 may be incomplete because it does not show the data items 13 and 14, which may be placed to a plurality of end positions of the sub-blocks as discussed below.

The input ninth data stream $PRU_{MB}$ 515 may be an input data stream to a data permutation device, such as, for example, the data permutation device 230 shown in FIG. 2. The miniband permutation 525 may re-arrange the positions of data items within the ninth data stream $PRU_{MB}$ 515 by accessing a data item from a first position in the ninth data stream $PRU_{MB}$ 515, and placing the data item in a second position in the permuted eleventh data stream $PPRU_{MB}$ 530, where the first and the second position numbers may be different.

The miniband permutation 525 is further explained as follows. First, the data permutation device 230 may receive the input ninth data stream $PRU_{MB}$ 515. System parameters, such as, for example, a sampling spacing P, may be determined. The sampling spacing P may indicate the number of positions between two consecutively sampled data items. For example, if P=4, the difference between the position of the first data item that is accessed and the position of the second data item that is subsequently accessed may be 4. In the example shown in FIG. 6, the data items will be accessed following the order at positions 1, 5, 9, . . . , etc., with the sampling spacing being 4 (P=4) between two consecutively sampled data items. The sampling spacing P may also indicate the difference between the positions of two consecutively placed data items. For example, data item 1 from the ninth data stream $PRU_{MB}$ 515 may be placed in the first position of the permuted data sequence, e.g., the eleventh data stream $PPRU_{MB}$ 530, and data item 2 from the ninth data stream $PRU_{MB}$ 515 may be placed in the fourth position of the permuted data sequence, e.g., the eleventh data stream $PPRU_{MB}$ 530. The difference between the positions of the first data item 1 and the second data item 2 within the permuted data sequence may be associated with the sampling spacing P.

Before accessing the data items from the input ninth data stream $PRU_{MB}$ 515, a first portion 540 having a first number of data items, and a second portion 550 having a second number of data items may be determined based on the input ninth data stream $PRU_{MB}$ 515. The first portion 540 may have a first length, e.g., the first number of data items. The second portion 550 may have a second length, e.g., the second number of data items. The sum of the first and second lengths may equal to the length of the ninth data stream $PRU_{MB}$ 515. The determination may be based on the result of ($K_{MB}$ mod P). The first portion 540 may contain the number 1 to number $K_{MB}-(K_{MB}$ mod P) data items, and the second portion 550 may contain the last ($K_{MB}$ mod P) data items, i.e., from the number $K_{MB}-(K_{MB}$ mod P)+1 to the number $K_{MB}$ data items. If ($K_{MB}$ mod P)=0, then the first portion 540 may contain all $K_{MB}$ data items of the entire input ninth data stream $PRU_{MB}$ 515, and the second portion 550 may contain 0 data items. The miniband permutation 525 may process the first portion 540. The resulting eleventh data stream $PPRU_{MB}$ 530 may be virtually or actually divided into P sub-blocks, each sub-block having a uniform number of ($K_{MB}-(K_{MB}$ mod P))/P positions for data items from the first portion 540.

In the example shown in FIG. 6, assuming P=4, then ($K_{MB}$ mod P)=2. Therefore, the first portion 540 contains $K_{MB}-(K_{MB}$ mod P)=12 data items [1, 2, 3, 4, 5, 6, 7, 8, 9, 10, 11, 12], while the second portion 550 contains the last ($K_{MB}$ mod P)=2 data items, i.e., data items 13 and 14, which may also be referred to as residual data items. The resulting eleventh data stream $PPRU_{MB}$ 530 may be virtually or actually divided into P=4 sub-blocks, a first sub-block 601, a second sub-block 602, a third sub-block 603, and a fourth sub-block 604. Each sub-block may have a uniform number of ($K_{MB}-(K_{MB}$ mod P))/P=3 data items from the first portion 540.

The miniband permutation 525 may access data items from the first portion 540 according to the sampling spacing P until the position to be accessed falls out of the range of the first portion 540. For example, the miniband permutation 525 may access data items [1, 5, 9] sequentially from the first portion 540. Because 9+4=13, which falls out of the range of the first portion 540, the miniband permutation 525 returns to the beginning of the first portion 540, and starts accessing from the number 2 position at the predetermined sampling spacing P, e.g., [2, 6, 10]. The data items from the first portion 540 may be placed into the first sub-block 601 of the resulting eleventh data stream $PPRU_{MB}$ 530 in an order same as the order the data items are accessed. As shown in FIG. 5, [1, 5, 9] are placed into the first sub-block 601. Similarly, [2, 6, 10] are accessed from the first portion 540 and placed into the second sub-block 602, [3, 7, 11] are accessed from the first portion 540 and placed into the third sub-block 603, and [4, 8, 12] are accessed from the first portion 540 and placed into the fourth sub-block 604.

Each sub-block may have a left and a right end position that may be placed with a residual data item. Among the four sub-blocks, there may be eight possible positions, as indicated by first end position 611 and second end position 612 associated with the first sub-block 601, third end position 621 and fourth end position 622 associated with the second sub-block 602, fifth end position 631 and sixth end position 632 associated with the third sub-block 603, and seventh end position 641 and eighth end position 642 associated with the fourth sub-block 604, for placing the residual data items 13 and 14. A plurality of methods may be utilized to determine the end position where the residual data items may be placed. The end position to place the residua data items may be determined based on at least one of a position number of the residual data items to be placed, and a position number of one of the data items within the first portion 540. For example, to place residual data item 13, the end position within the sub-blocks may be determined using the position number (e.g., 13) of the residual data item 13, and a position number (e.g., 5, or 9) of one of the data items within the first portion 540. An exemplary method may include taking any number c (e.g., 5, or 9) from position numbers 1-12, and using the result of (13 mod c) and (14 mod c) to determine the end positions for residual data items 13 and 14.

The disclosed miniband permutation method may place (e.g., insert) a residual data item to any one of the eight possible end positions within the four sub-blocks. For example, data item 13 may be placed into the second end position 612, and data item 14 may be placed into the fourth end position 622. Accordingly, the resulting eleventh data stream $PPRU_{MB}$ 530 may become [1, 5, 9, 13, 2, 6, 10, 14, 3, 7, 11, 4, 8, 12]. For another example, data item 13 may be placed into the first end position 611, and the data item 14 may be placed into the second end position 612. Accordingly, the resulting eleventh data stream $PPRU_{MB}$ 530 may become [13, 1, 5, 9, 14, 2, 6, 10, 3, 7, 11, 4, 8, 12]. In one embodiment, a residual data item may be placed into the left end position (i.e., first end position 611) of the first sub-block 601, or the right end position (i.e., eighth end position 642) of the last sub-block 604. In one embodiment, at least one of the residual data items is placed into a sub-block that is not adjacent to any sub-block placed with one of the second number of data items. For example, residual data item 13 may be placed into the left end position (i.e., first end position 611) of the first sub-block 601, while the residual data item 14 may be placed into the right end position (i.e., eighth end position 642) of the last sub-block 604. Accordingly, the sub-block to which the residual data item 13 is placed is not adjacent to the sub-block to which the residual data item 14 is placed.

In one embodiment, the above disclosed miniband permutation 525 may also be realized by performing a permutation based on at least one of the following equations:

$$PPRU_{MB}[j]=PRU_{MB}[i], j=0, 1, \ldots, K_{MB}-1; \quad (3)$$

$$i=(q(j) \bmod D)*P+\text{floor}(q(j)/D) \quad (4)$$

$$P=\min(K_{MB}, N_1/N_2) \quad (5)$$

$$r(j)=\max(j-(K_{MB} \bmod P)*D, 0) \quad (6)$$

$$q(j)=j+\text{floor}(r(j)/(D-1)) \quad (7)$$

$$D=\text{floor}(K_{MB}/P+1) \quad (8)$$

where floor( ), min( ), max( ), and mod( ) are well known mathematical functions. Index i indicates the i-th position within the ninth data stream $PRU_{MB}$ 515, and index j indicates the j-th position within the eleventh data stream $PPRU_{MB}$ 530. Index i may vary in the same range as index j, i.e., in the range of 0, 1, . . . , $K_{MB}-1$. $PRU_{MB}$ [i] indicates the i-th data item within the ninth data stream $PRU_{MB}$ 515, and $PPRU_{MB}$ [j] indicates the j-th data item within the eleventh data stream $PPRU_{MB}$ 530. Equation $PPRU_{MB}$ [j]=$PRU_{MB}$ [i] represents a mapping relationship between the data sequence being permuted $PRU_{MB}$ and the permuted data sequence $PPRU_{MB}$.

With the permutation sequence determined from above equations, and following the above described miniband permutation 525, the ninth data stream $PRU_{MB}$ 515=[1, 2, 3, 4, 5, 6, 7, 8, 9, 10, 11, 12, 13, 14] may be permuted into the eleventh data stream $PPRU_{MB}$ 530=[1, 5, 9, 13, 2, 6, 10, 14, 3, 7, 11, 4, 8, 12].

Figure 7:
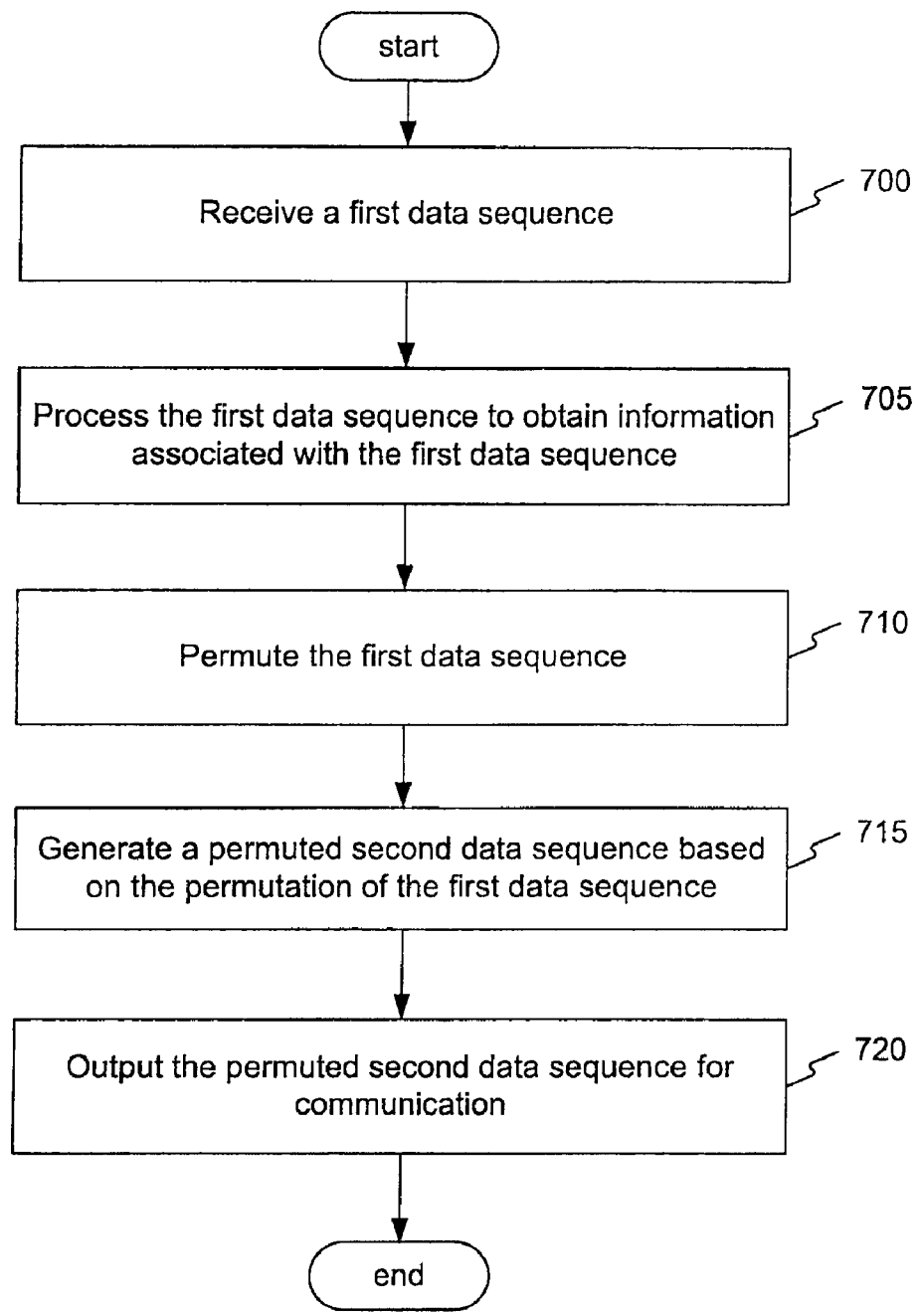
FIG. 7 is an exemplary flow chart of a method for providing wireless communication consistent with the disclosed embodiments.

FIG. 7 illustrates an exemplary flow chart of a method for providing wireless communication consistent with the disclosed embodiments. The communication process may be implemented within the communication systems shown in FIGS. 1 and 2. The process may start with receiving a first data sequence that is to be permuted, which may be denoted as $PRU_{MB}$ (Step 700). A data receiving interface, such as, the data receiving interface 105 or the data receiving interface 205, may receive the first data sequence $PRU_{MB}$. The first data sequence $PRU_{MB}$ may include a first number of data items. The data items may include minibands, PRUs, DRUs, LRUs or other suitable data items. In one embodiment, the data items may be minibands, and the first number of data items within the first data sequence $PRU_{MB}$ may be denoted as $K_{MB}$, which may also indicate a length of the first data sequence $PRU_{MB}$. $K_{MB}$ may be an integer number. The first data sequence $PRU_{MB}$ may be processed by a data processing device, for example, the data processing device 110 or the data processing device 220, to obtain information associated with the first data sequence $PRU_{MB}$ (Step 705). The information may include at least one of the first number $K_{MB}$ and the sampling spacing P. In one embodiment, the first number $K_{MB}$ may be obtained based on $L_{MB}$, which indicates the total number of PRUs in the first data sequence $PRU_{MB}$, e.g., $K_{MB}=L_{MB}/N_2$. The sampling spacing P may be obtained based on the first number $K_{MB}$. For example, equation (5) shows one embodiment to obtain the sampling spacing P from the first number $K_{MB}$. Other methods to obtain the sampling spacing P based on the first number $K_{MB}$ may also be used.

The first data sequence $PRU_{MB}$ may be permuted by a data permutation device, for example, the data permutation device 135 or the data permutation device 230 (Step 710), and generate a permuted second data sequence, which may be denoted as $PPRU_{MB}$, based on the permutation of the first data sequence $PRU_{MB}$ (Step 715). The permuted second data sequence $PPRU_{MB}$ may include a second number of data items, which may indicate a length of the permuted second data sequence. The second number may be the same as the first number $K_{MB}$. The permuted second data sequence $PPRU_{MB}$ may be output through an output interface for communication, for example, the output interface 160 or the output interface 260 (Step 720).

Figure 8:
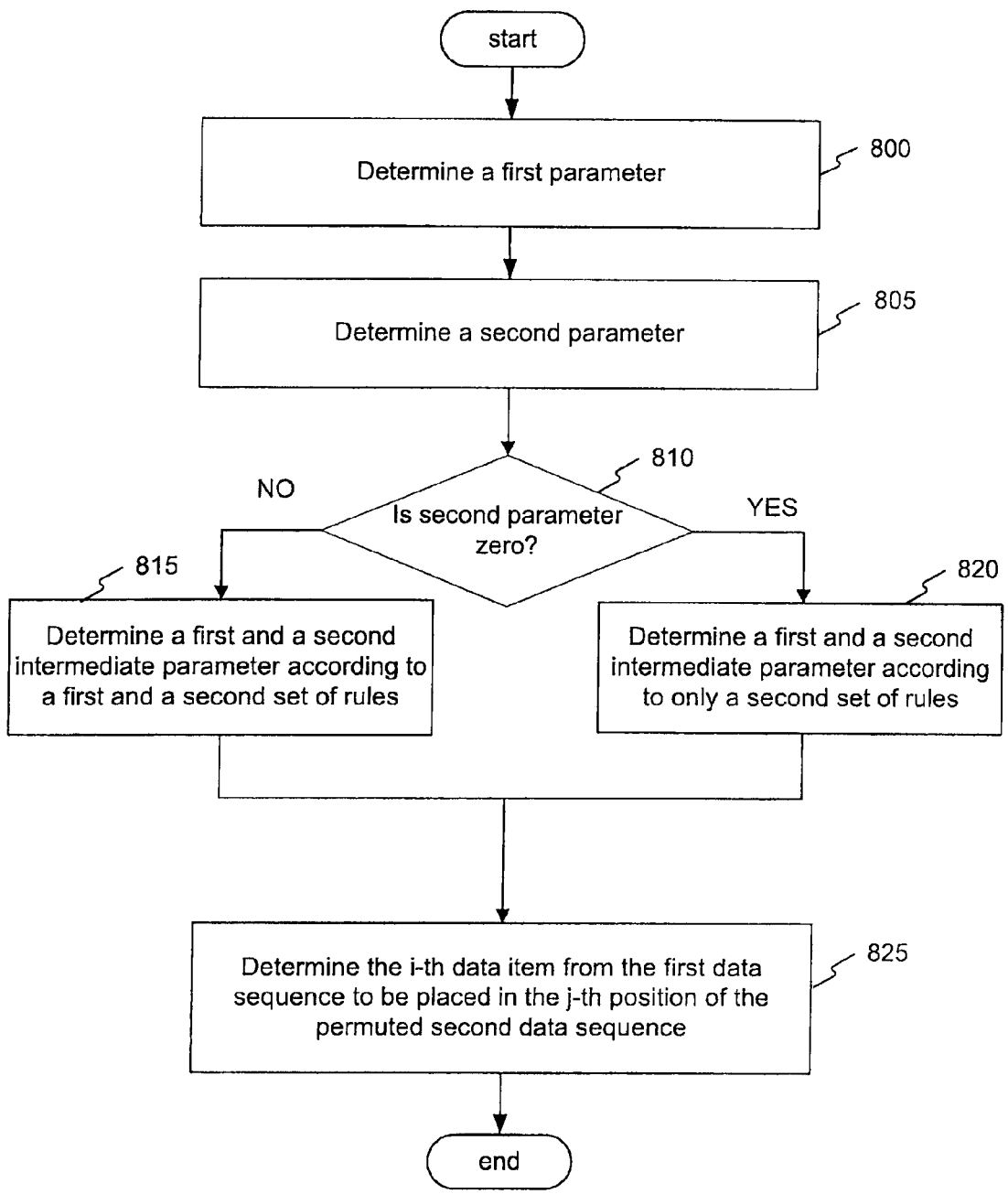
FIG. 8 is an exemplary flow chart of a permutation process consistent with the disclosed embodiments.

FIG. 8 illustrates an exemplary flow chart of a permutation process consistent with the disclosed embodiments. The permutation process may be implemented as a miniband permutation, a part of an outer permutation, or a part of an inner permutation. The permutation process may be performed by a data permutation device, such as, for example, the data permutation device 135 or the date permutation device 230. The permutation process may be performed on the first data sequence $PRU_{MB}$, and may be implemented in Step 710.

The permutation process may be based on at least one of equations (3)-(8). For example, the permutation process may determine a first parameter based on at least one of the first number and the sampling spacing (Step 800). Equation (8) shows an embodiment of the first parameter, represented by D. The permutation process may determine a second parameter based on at least one of the first parameter D, the first number $K_{MB}$, and the sampling spacing P. The second parameter may be represented by ($K_{MB}$ mod P)*D, as shown in equation (6).

The permutation process may determine a mapping relationship between the j-th data item of the permuted second data sequence $PPRU_{MB}$, and the i-th data item of the first data sequence $PRU_{MB}$ (Steps 810-825). The mapping relationship may be determined based on at least one of the index j, the first parameter D, and the second parameter ($K_{MB}$ mod P)*D. In one embodiment, the permutation process may determine whether the second parameter ($K_{MB}$ mod P)*D is zero (Step 810). If ($K_{MB}$ mod P)*D is non-zero (NO, Step 810), the permutation process may determine a first and a second intermediate parameter based on a first and a second set of rules (Step 815). Equations (6) and (7) illustrate embodiments of the first and second intermediate parameters. For example, the first intermediate parameter may be represented by r(j) shown in equation (6), and the second intermediate parameter may be represented by q(j) shown in equation (7). The first intermediate parameter r(j) may be determined, for example, by the data permutation device 135 or 230, based on at least one of the index j, the first parameter D, and the second parameter ($K_{MB}$ mod P)*D. The second intermediate parameter q(j) may be determined, for example, by the data permutation device 135 or 230, based on at least one of the first intermediate parameter r(j), the index j, and the first parameter D. The first and second sets of rules may be derived from equations (6) and (7). The details of the first and second sets of rules are explained below. When the second parameter ($K_{MB}$ mod P)*D is non-zero, the permutation process may compare a parameter associated with the index j with the second parameter ($K_{MB}$ mod P)*D. In the exemplary equations (3)-(8), the parameter associated with the index j is the same as the index j. If the result of the comparison indicates that the parameter associated with the index j is smaller than ($K_{MB}$ mod P)*D, e.g., if j is smaller than ($K_{MB}$ mod P)*D, the first intermediate parameter r(j) and the second intermediate parameter q(j) may be determined according to the following (first set of) rules that may be derived from equations (6) and (7):

$$r(j)=\max(j-(K_{MB}\bmod P)*D, 0)=0 \quad (9)$$

$$q(j)=j+\mathrm{floor}(r(j)/(D-1))=j \quad (10)$$

If the result of the comparison indicates that the index j is no smaller than ($K_{MB}$ mod P)*D, the first intermediate parameter r(j) and the second intermediate parameter q(j) may be determined according to the following (second set) of rules that may be derived from equations (6) and (7):

$$r(j)=\max(j-(K_{MB}\bmod P)*D, 0)=j-(K_{MB}\bmod P)*D \quad (11)$$

$$q(j)=j+\mathrm{floor}(r(j)/(D-1)) \quad (12)$$

Equation (12) may be the same as equation (7). When ($K_{MB}$ mod P)*D is zero (YES, Step 810), which may be satisfied when ($K_{MB}$ mod P) is zero, the permutation process may determine the first and second intermediate parameters r(j) and q(j) according to only the second set of rules, as shown in equations (11) and (12). After determining the first and second intermediate parameters r(j) and q(j), the permutation sequence may determine the i-th data item from the first data sequence, i.e., $PRU_{MB}$ [i], which is to be placed into the j-th position of the permuted second data sequence $PPRU_{MB}$ (Step 825). To determine the i-th data item, the permutation process may determine a value of the index i based on at least one of the index j, the sampling spacing P, the first parameter D, and the second intermediate parameter q(j). Equation (4) shows one embodiment to determine the value of the index i. When the index i is determined, a mapping relationship is determined between the first data sequence $PRU_{MB}$ that is subject to permutation and the permuted second data sequence $PPRU_{MB}$, as shown in equation (3). Equation (3) indicates that the j-th data item in the permuted second data sequence $PPRU_{MB}$ equals to the i-th data item in the first data sequence $PRU_{MB}$.

In one embodiment, the permutation process indicated in Step 710 and Steps 800-825 shown in FIGS. 7 and 8, may also be implemented based on one or more of the following equations:

$$PPRU_{MB}[j]=PRU_{MB}[i], j=0, 1, \ldots, L_{MB}-1; \quad (13)$$

$$i=((q(j)\bmod D)*P+\mathrm{floor}(q(j)/D)*N_2)+(j\bmod N_2) \quad (14)$$

$$P=\min(L_{MB}, N_1) \quad (15)$$

$$r(j)=\max(\mathrm{floor}(j/N_2)-(L_{MB}\bmod P)*D/N_2, 0) \quad (16)$$

$$q(j)=\mathrm{floor}(j/N_2)+\mathrm{floor}(r(j)/(D-1)) \quad (17)$$

$$D=\mathrm{floor}(L_{MB}/P+1) \quad (18)$$

For example, $L_{MB}$ may represent the first number of data items, which may be PRUs, included within the first data sequence $PRU_{MB}$ that is to be permuted. $L_{MB}$ may also indicate the length of the first data sequence $PRU_{MB}$. $L_{MB}$ may further indicate the total number of data items included within the permuted second data sequence $PPRU_{MB}$ or the length of the permuted second data sequence $PPRU_{MB}$. D may represent the first parameter. ($L_{MB}$ mod P)*D/$N_2$ may represent the second parameter. r(j) and q(j) may represent the first and second intermediate parameters respectively. P may represent the sampling spacing.

Still referring to FIG. 8, the permutation process may determine a mapping relationship between the j-th data item of the permuted second data sequence $PPRU_{MB}$, and the i-th data item of the first data sequence $PRU_{MB}$ (Steps 810-825). The determination of the mapping relationship may be based on at least one of the index j, the first parameter D, and the second parameter ($L_{MB}$ mod P)*D/$N_2$. In one embodiment, the permutation process may determine whether the second parameter ($L_{MB}$ mod P)*D/$N_2$ is zero (Step 810). If ($L_{MB}$ mod P)*D/$N_2$ is non-zero (NO, Step 810), the permutation process may determine the first and second intermediate parameters r(j) and q(j) based on a first and second set of rules associated with equations (16) and (17) (Step 815). The first intermediate parameter r(j) may be determined based on at least one of the index j, the first parameter D, and the second parameter ($L_{MB}$ mod P)*D/$N_2$. The second intermediate parameter q(j) may be determined based on at least one of the first intermediate parameter r(j), the index j, and the first parameter D. The details of the first and second sets of rules are explained below.

In the exemplary equations (13)-(18), the parameter associated with the index j may be expressed as floor (j/$N_2$). When the second parameter ($L_{MB}$ mod P)*D/$N_2$ is non-zero, the permutation process may compare the parameter associated with the index j, e.g., floor (j/$N_2$), with the second parameter ($L_{MB}$ mod P)*D/$N_2$. If the result of the comparison indicates that floor (j/$N_2$) is smaller than ($L_{MB}$ mod P)*D/$N_2$, the first intermediate parameter r(j) and the second intermediate parameter q(j) may be determined according to the following first set of rules that may be derived from equations (16) and (17):

$$r(j)=0 \quad (19)$$

$$q(j)=\text{floor}(j/N_2) \quad (20)$$

If the result of the comparison indicates that floor $(j/N_2)$ is greater than or equal to $(L_{MB} \bmod P)*D/N_2$, the first intermediate parameter r(j) and the second intermediate parameter q(j) may be determined according to the following second set of rules that may be derived from equations (16) and (17):

$$r(j)=\text{floor}(j/N_2)-(L_{MB} \bmod P)*D/N_2 \quad (21)$$

$$q(j)=\text{floor}(j/N_2)+\text{floor}(r(j)/(D-1)) \quad (22)$$

Equation (22) is may be the same as equation (17). If $(L_{MB} \bmod P)*D/N_2$ is zero (YES, Step 810), which may be satisfied when $(L_{MB} \bmod P)$ is zero, the permutation process may determine the first and second intermediate parameters r(j) and q(j) according to only the second set of rules, as shown in equations (21) and (22).

After determining the first and second intermediate parameters r(j) and q(j), the permutation sequence may determine the i-th data item from the first data sequence, i.e., $PRU_{MB}[i]$, which is to be placed into the j-th position of the permuted second data sequence $PPRU_{MB}$ (Step 825). To determine the i-th data item, the permutation process may determine a value of the index i based on at least one of the first and second intermediate parameters r(j) and q(j). The index i may be determined based on at least one of the index j, the sampling spacing P, the first parameter D, and the second intermediate parameter q(j). Equation (14) shows one embodiment to determine the value of the index i. When the index i is determined, a mapping relationship is determined between the first data sequence $PRU_{MB}$ that is subject to permutation and the permuted second data sequence $PPRU_{MB}$, as shown in equation (13). Equation (13) indicates that the j-th data item in the permuted second data sequence $PPRU_{MB}$ equals to the i-th data item in the first data sequence $PRU_{MB}$.

In one embodiment, the above-disclosed miniband permutation 525 and the permutation process shown in Step 710 may also be implemented based on one or more of the following equations:

$$PPRU_{MB}[j]=PRU_{MB}[i], j=0, 1, \ldots, L_{MB}-1; \quad (23)$$

$$i=(q(j) \bmod D)*P+\text{floor}(q(j)/D) \quad (24)$$

$$P=\min(K_{MB}, N_1/N_2) \quad (25)$$

$$r(j)=\max(j-(K_{MB} \bmod P)*D, 0) \quad (26)$$

$$q(j)=j+\text{floor}(r(j)/(D-1)) \quad (27)$$

$$D=\text{floor}(K_{MB}/P+1) \quad (28)$$

Equations (23)-(28) may be substantially similar to equations (3)-(8), except that in equation (23), the range of the index j is from 0 to $L_{MB}-1$. In this embodiment, $L_{MB}$ may indicate the total number of data items (or the length) of the first data sequence $PRU_{MB}$ that is subject to permutation, and the permuted second data sequence $PPRU_{MB}$. $K_{MB}$ may be calculated from $K_{MB}=L_{MB}/N_2$. $L_{MB}$ may represent the first number of data items included within the first data sequence $PRU_{MB}$. The index i may also be within the same range as the index j, i.e., i=0, 1, ..., $L_{MB}-1$, with the value of the index i corresponding to a given index j being determined from equation (24).

In this embodiment, the permutation process based on equations (23)-(28) may be applicable to the communication method discussed above in connection with FIG. 7. When the first data sequence $PRU_{MB}$ is received (Step 705), the first data sequence $PRU_{MB}$ may be processed to obtain information associated with the first data sequence $PRU_{MB}$. For example, the information may include the first number $L_{MB}$, which may represent the total number of data items included within the first data sequence $PRU_{MB}$ (or may represent the length). The information may also include a second number, denoted as $K_{MB}$, which may be determined from $K_{MB}=L_{MB}/N_2$. Further, the information may include the sampling spacing P. The sampling spacing P may be determined from equation (25). The first data sequence $PRU_{MB}$ may be permuted (Step 710). An exemplary permutation process that may be implemented in Step 710 is shown in FIG. 8, which will be discussed below in connection with equations (23)-(28). After the first data sequence is permuted, the second data sequence $PPRU_{MB}$ may be generated and output for communication (Steps 715 and 720).

Referring to FIG. 8, the permutation process may determine a first parameter, for example, denoted as D, based on at least one of the second number $K_{MB}$ and the sampling spacing P (Step 800). Equation (28) shows an examplary process to determine the first parameter D. The permutation process may also determine a second parameter, for example, denoted as $(K_{MB} \bmod P)*D$, based on at least one of the second number $K_{MB}$, the sampling spacing P, and the first parameter D (Step 805). The permutation process may continue with Steps 810-825 in a manner similar to that discussed above in connection with the embodiment that employs equations (3)-(12).

In the prior art, for example, in Reference 1, inner and/or outer permutation sequences may be obtained from a lookup table stored in a memory. The prior art method of obtaining a permutation sequence may require a large number of additional memories or other storage devices for storing the lookup table in certain applications, such as applications where the communication system supports flexible parameters and/or flexible sequence lengths. In some instances, this requirement may lead to increased hardware complexity, operational costs, or both.

Consistent with one embodiment of the present disclosure, the inner and/or outer permutation sequences, including the permutation sequences for the miniband permutation, may be generated using a computational circuit based on at least one content of the data stream to be permuted, such as, for example, a length of the data stream to be permuted. The permutation sequences may be computed based on at least one of equations (1)-(28) using the computational circuit.

Figure 9B:
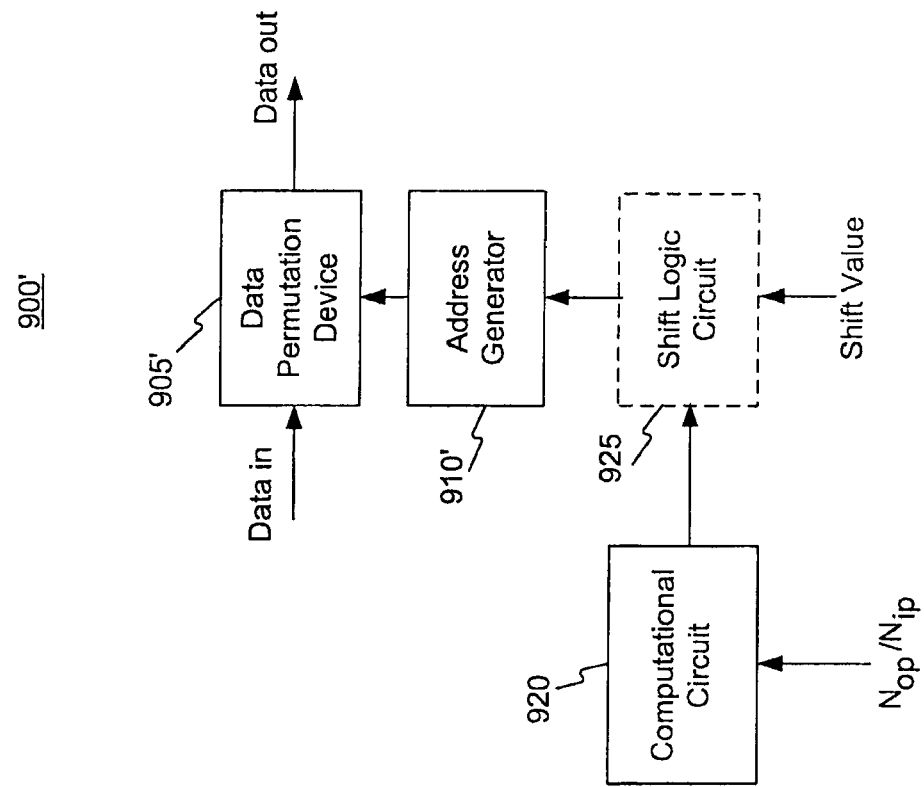
FIG. 9B is a schematic illustration of an exemplary hardware architecture for implementing permutation methods consistent with the disclosed embodiments.
Figure 9A:
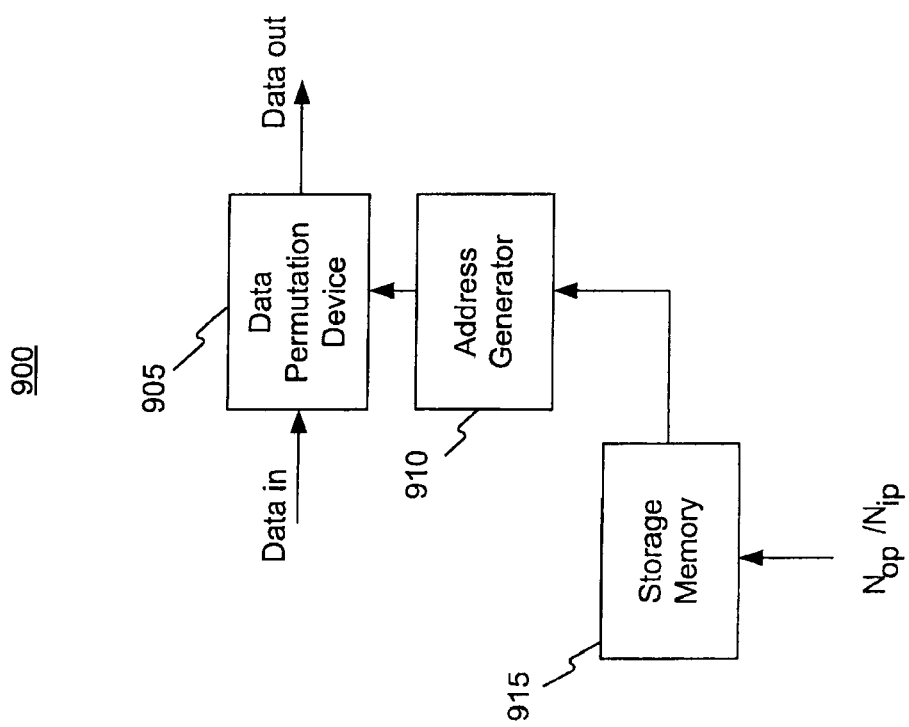
FIG. 9A is a schematic illustration of an exemplary hardware architecture for implementing permutation methods consistent with the disclosed embodiments.

FIG. 9A illustrates an exemplary hardware architecture 900 for implementing a permutation method, such as one disclosed in the prior art. As shown in FIG. 9A, the hardware architecture 900 for such a permutation method may include a data permutation device 905. The data permutation device 905 which may be configured to receive an input data stream, permute the input data stream according to one or more predetermined permutation sequences stored in a lookup table, and generate an output data stream. The lookup table may be stored in a memory, and may contain predetermined permutation sequences for different length of the data stream. Data permutation device 905 may include devices known in the art, for example, a memory or a processing unit for performing permutations. An address generator 910 may be configured to provide address information to the data permutation device 905 for performing the permutation on the data stream. The hardware architecture 900 may further include a storage memory 915 (or other storage devices) for storing the lookup table that contains predetermined permutation sequences.

When a data stream is received, one of the predetermined permutation sequences may be selected from the lookup table based on the length of the received data stream that is to be permuted or based on other parameters, such as, for example, $N_{op}$ and $N_{ip}$ related to outer and/or inner permutations respectively.

FIG. 9B illustrates an exemplary hardware architecture 900' for implementing a permutation method consistent with the disclosed embodiments for generating permutation sequences. The hardware architecture 900' may include a data permutation device 905', which may be similar to the data permutation device 905 of FIG. 9A, the data permutation device 135 shown in FIG. 1, and/or the data permutation device 230 shown in FIG. 2. The data permutation devices 905' may be configured to apply a permutation to a data stream. The data permutation device 905' may receive an input data stream, permute the input data stream according to one or more permutation sequences, and generate an output data stream. The hardware architecture 905' may include an address generator 910', which may be similar to the address generator 910 of FIG. 9A. The hardware architecture 900' may also include a computational circuit 920 configured to generate the permutation sequences for the inner and/or the outer permutations, including the miniband permutation, according to at least one of equations (1)-(28). In one embodiment, the computational circuit 920 may be free of storage memory.

In some embodiments, the hardware architecture 900' may include a shift logic circuit 925 located downstream of the computational circuit 920. The shift logic circuit 925 may be configured to shift data contents of the a data sequence, such as a permutation sequence generated by the computational circuit 920. The shift logic circuit 925 may be configured to cyclically shift the data contents of the data sequence to the right or to the left by a predetermined number of times. For example, the shift logic circuit 925 may be configured to shift the basic inner permutation sequence $P_0$ and generate $P_s$ shown in equations (1) and (2). In some embodiments, the shift logic circuit 925 may be integral with the computational circuit 920, or may be omitted. The hardware architecture 900' for implementing permutation methods consistent with the present disclosure may be part of the system 100 shown in FIG. 1 on the transmitter side of a communication system, or part of the system 200 shown in FIG. 2 on the receiver side of the communication system.

In one embodiment, permutation sequences are non-predetermined, and are computed using the computational circuit 920 based on at least one of the equations (1)-(28) for inner and/or outer permutations, including the miniband permutation. In one embodiment, the permutation sequences may not be stored in a lookup table, and therefore, large amount of additional storage memories or other storage devices may not be needed for storing the permutation sequences. When system parameters of the communication system are changed, permutation sequences may be re-calculated by the computational circuit 920 based on the changed system parameters. The data permutation device 905' may obtain a re-calculated permutation sequence from the computational circuit 920 and apply the re-calculated permutation sequence in the inner and/or outer permutations, including the miniband permutation.

In one embodiment, non-predetermined permutation sequences may be computed using the computational circuit 920, and may be stored in an intermediate lookup table that may in turn be stored in a memory. In one embodiment, the memory for storing the lookup table may be part of the data permutation device 905'. The intermediate lookup table may be re-configurable, dynamic, or updatable. The permutation sequences may be computed by the computational circuit 920 based on at least one of the equations (1)-(28). The data permutation device 905' may obtain a permutation sequence from the intermediate lookup table and apply the permutation sequence to permute the data stream. The permutation sequences stored in the intermediate lookup table may be updated. For example, when system parameters are changed, the computational circuit 920 may re-calculate the permutation sequences based on the changed system parameters. The re-calculated permutation sequences may be used to update or re-configure the intermediate lookup table. The data permutation device 905' may obtain a permutation sequence, which may be updated, from the updated or re-configured intermediate lookup table, and apply the permutation sequence to permute the data stream.

The disclosed methods and systems may be employed in wireless communication systems or other systems where data permutation may be performed. For example, the disclosed methods and systems for data permutation may be implemented in the transmitter and/or receiver side of a communication system. In some applications, the disclosed methods for generating data permutation sequences may be implemented using computational circuits without relying on lookup tables or other components that store predetermined permutation sequences. The disclosed embodiments, in some applications, may reduce or eliminate the need of additional memories or other storage devices for storing predetermined permutation sequences. The disclosed methods and systems for data permutation, in some applications, may reduce the complexity of the hardware architecture of a communication system and/or may improve the performance of the communication system. In some applications, the disclosed methods for generating data permutation sequences may be implemented using a computational circuit and may store the computed data permutation sequences in an intermediate lookup table, which may be updated or re-configured using re-calculated permutation sequences when system parameters are changed.

It will be apparent to those skilled in the art that various modifications and variations can be made to the disclosed method and system for data permutation in a communication system. It is intended that the specification and examples be considered as exemplary only, with a true scope of the disclosure being indicated by the following claims and their equivalents.

What is claimed is:

1. A wireless communication method implemented in a communication system, the method comprising:

receiving a first data sequence at a data receiving interface of the communication system, the first data sequence having a first number of data items;

processing the first data sequence by a data processing device of the communication system, the first data sequence being processed to obtain information associated with the first data sequence, the information containing at least one of the first number and a sampling spacing;

permuting the first data sequence by a data permutation device of the communication system to generate a permuted second data sequence, wherein permuting the first data sequence comprises:

determining a first parameter based on at least one of the first number and the sampling spacing;

determining a second parameter based on at least one of the first parameter, the first number, and the sampling spacing; and determining a mapping relationship between a j-th data item of the permuted second data sequence and an i-th data item of the first data sequence based on at least one of index j, the first parameter, and the second parameter, indexes i and j being integers; and outputting the permuted second data sequence through an output interface of the communication system, wherein permuting the first data sequence by the data permutation device further comprises:

determining, by the data permutation device, a first intermediate parameter based on at least one of the index j, the first parameter, and the second parameter; and determining, by the data permutation device, a second intermediate parameter based on at least one of the first intermediate parameter, the index j, and the first parameter, and wherein determining the first and the second intermediate parameters comprises:

comparing, by the data permutation device, the second parameter with a parameter associated with the index j; and determining, by the data permutation device, the first and second intermediate parameters based on a result of the comparison.

2. The wireless communication method of claim 1, further comprising:

determining, by the data permutation device, the index i based on at least one of the index j, the sampling spacing, the first parameter, and the second intermediate parameter.

3. The wireless communication method of claim 1, wherein determining the first and second intermediate parameters based on the result of the comparison comprises:

determining, by the data permutation device, when the second parameter is non-zero, the first and second intermediate parameters based on a first set of rules when the parameter associated with the index j is smaller than the second parameter; and determining, by the data permutation device, the first and second intermediate parameters based on a second set of rules when the parameter associated with the index j is no smaller than the second parameter.

4. The wireless communication method of claim 3, wherein when the second parameter is zero, determining the first and second intermediate parameters is based on only the second set of rules.

5. The wireless communication method of claim 1, wherein permuting the first data sequence is based on at least one of following equations:

$$PPRU_{MB}[j]=PRU_{MB}[i], j=0, 1, \ldots, K_{MB}-1;$$

$$i=(q(j) \bmod D)*P+\text{floor}(q(j)/D);$$

$$P=\min(K_{MB}, N_1/N_2);$$

$$r(j)=\max(j-(K_{MB} \bmod P)*D, 0);$$

$$q(j)=j+\text{floor}(r(j)/(D-1)); \text{ and}$$

$$D=\text{floor}(K_{MB}/P+1);$$

wherein $PPRU_{MB}$ is the permuted second data sequence, and $PRU_{MB}$ is the first data sequence, $K_{MB}$ is the first number, $N_1$ and $N_2$ are predetermined integer numbers, D is the first parameter, $(K_{MB} \bmod P)*D$ is the second parameter, r(j) is a first intermediate parameter, and q(j) is a second intermediate parameter.

6. The wireless communication method of claim 5, wherein when ($K_{MB} \bmod P$) is non-zero, and when the index j is smaller than ($K_{MB} \bmod P$)*D, the first and second intermediate parameters r(j) and q(j) are determined based on a first set of rules: r(j)=0, and q(j)=j.

7. The wireless communication method of claim 5, wherein when ($K_{MB} \bmod P$) is non-zero, and when the index j is no smaller than ($K_{MB} \bmod P$)*D, the first and second intermediate parameters r(j) and q(j) are determined based on a second set of rules: r(j)=j-($K_{MB} \bmod P$)*D, and q(j)=j+floor (r(j)/(D-1)).

8. The wireless communication method of claim 7, wherein when ($K_{MB} \bmod P$) is zero, the first and second intermediate parameters r(j) and q(j) are determined based on only the second set of rules.

9. The wireless communication method of claim 5, wherein the first data sequence is a miniband having a plurality of physical resource units.

10. The wireless communication method of claim 1, wherein permuting the first data sequence is based on at least one of following equations:

$$PPRU_{MB}[j]=PRU_{MB}[i], j=0, 1, \ldots, L_{MB}-1;$$

$$i=((q(j) \bmod D)*P+\text{floor}(q(j)/D)*N_2)+(j \bmod N_2);$$

$$P=\min(L_{MB}, N_1);$$

$$r(j)=\max(\text{floor}(j/N_2)-(L_{MB} \bmod P)*D/N_2, 0);$$

$$q(j)=\text{floor}(j/N_2)+\text{floor}(r(j)/(D-1)); \text{ and}$$

$$D=\text{floor}(L_{MB}/P+1);$$

wherein $PPRU_{MB}$ is the permuted second data sequence, and $PRU_{MB}$ is the first data sequence, $L_{MB}$ is the first number, $N_1$ and $N_2$ are predetermined integer numbers, D is the first parameter, $(L_{MB} \bmod P)*D/N_2$ is the second parameter, r(j) is a first intermediate parameter, and q(j) is a second intermediate parameter.

11. The wireless communication method of claim 10, wherein when the second parameter ($L_{MB} \bmod P$)*$D/N_2$ is non-zero, and when floor ($j/N_2$) is smaller than ($L_{MB} \bmod P$)*$D/N_2$, the first and second intermediate parameters r(j) and q(j) are determined based on a first set of rules: r(j)=0, and q(j)=floor (j/$N_2$).

12. The wireless communication method of claim 10, wherein when the second parameter ($L_{MB} \bmod P$)*$D/N_2$ is non-zero, and when floor ($j/N_2$) is no smaller than ($L_{MB} \bmod P$)*$D/N_2$, the first and second intermediate parameters r(j) and q(j) are determined based on a second set of rules: r(j)=floor ($j/N_2$)-($L_{MB} \bmod P$)*$D/N_2$, and q(j)=floor ($j/N_2$)+ floor (r(j)/(D-1)).

13. The wireless communication method of claim 12, wherein when the second parameter ($L_{MB} \bmod P$)*$D/N_2$ is zero, the first and second intermediate parameters r(j) and q(j) are determined based on only the second set of rules.

14. A wireless communication method implemented in a communication system, comprising:

receiving a first data sequence to be permuted;

identifying at least a length of the first data sequence and a sampling spacing for permutation;

determining a mapping relationship between the first data sequence and a second data sequence that is generated by permuting the first data sequence, wherein determining the mapping relationship comprises:

identifying an i-th data item from the first data sequence for a corresponding j-th position in the second data sequence based on index j and at least one of the length of the first data sequence and the sampling spacing; and outputting the second data sequence for wireless communication, wherein identifying the i-th data item from the first data sequence comprises:

determining, by a data permutation device, a first parameter based on at least one of the length of the first data sequence and the sampling spacing;

determining, by the data permutation device, a second parameter based on at least one of the length of the first data sequence, the sampling spacing, and the first parameter; and determining, by the data permutation device, a value of index i based on at least one of a value of the first parameter, and a comparison result between a parameter associated with the index j and a value of the second parameter, and wherein determining the value of the index i comprises:

determining the value of the index i based on a first set of rules, when the value of the second parameter is non-zero, and when the parameter associated with the index j is smaller than the value of the second parameter; and determining the value of the index i based on a second set of rules when the value of the second parameter is non-zero and when the parameter associated with the index j is no smaller than the value of the second parameter.

15. The wireless communication method of claim 14, wherein when the value of the second parameter is zero, determining the value of the index i is based on only the second set of rules.

16. The wireless communication method of claim 14, wherein determining the mapping relationship is based on at least one of following equations:

$$PPRU_{MB}[j]=PRU_{MB}[i], j=0,1,\ldots,K_{MB}-1;$$

$$i=(q(j) \bmod D)*P+\text{floor}(q(j)/D);$$

$$P=\min(K_{MB}, N_1/N_2);$$

$$r(j)=\max(j-(K_{MB} \bmod P)*D, 0);$$

$$q(j)=j+\text{floor}(r(j)/(D-1)); \text{ and}$$

$$D=\text{floor}(K_{MB}/P+1);$$

wherein $PPRU_{MB}$ is the second data sequence, and $PRU_{MB}$ is the first data sequence, $K_{MB}$ is the length of the first data sequence, $N_1$ and $N_2$ are predetermined integer numbers, D is a first parameter, $(K_{MB} \bmod P)*D$ is a second parameter, $r(j)$ is a first intermediate parameter, and $q(j)$ is a second intermediate parameter.

17. The wireless communication method of claim 14, wherein determining the mapping relationship is based on at least one of following equations:

$$PPRU_{MB}[j]=PRU_{MB}[i], j=0,1,\ldots,L_{MB}-1;$$

$$i=((q(j) \bmod D)*P+\text{floor}(q(j)/D)*N_2)+(j \bmod N_2);$$

$$P=\min(L_{MB}, N_1);$$

$$r(j)=\max(\text{floor}(j/N_2)-(L_{MB} \bmod P)*D/N_2, 0);$$

$$q(j)=\text{floor}(j/N_2)+\text{floor}(r(j)/(D-1)); \text{ and}$$

$$D=\text{floor}(L_{MB}/P+1);$$

wherein $PPRU_{MB}$ is the second data sequence, and $PRU_{MB}$ is the first data sequence, $L_{MB}$ indicates the length of the first data sequence, $N_1$ and $N_2$ are predetermined integer numbers, D is a first parameter, $(L_{MB} \bmod P)*D/N_2$ is a second parameter, $r(j)$ is a first intermediate parameter, and $q(j)$ is a second intermediate parameter.

18. The wireless communication method of claim 14, wherein the first data sequence is a miniband having a plurality of physical resource units.

19. A system for wireless communication, comprising:

a data receiving interface configured to receive a first data sequence to be permuted, the first data sequence having a first number of data items;

a data processing device coupled with the data receiving interface and configured to apply a permutation to the first data sequence and generate a permuted second data sequence, the data processing device comprising:

a permutation device configured to:

obtain information associated with the first data sequence, the information containing at least a sampling spacing;

determine a first parameter based on at least one of the first number and the sampling spacing;

determine a second parameter based on at least one of the first parameter, the first number, and the sampling spacing; and determine a mapping relationship between a j-th data item of the second data sequence and an i-th data item of the first data sequence based on at least one of index j, the first parameter, and the second parameter, indexes i and j being integers; and an output interface coupled with the data processing device and configured to output the permuted second data sequence for wireless communication, wherein the permutation device is further configured to:

determine a first intermediate parameter based on at least one of the index j, the first parameter, and the second parameter; and determine a second intermediate parameter based on at least one of the first intermediate parameter, the index j, and the first parameter, and wherein determining the first and the second intermediate parameters comprises:

comparing the second parameter with a parameter associated with the index j; and determining the first and second intermediate parameters based on a result of the comparison.

20. The system of claim 19, wherein the permutation device is configured to determine the first parameter, determine the second parameter, and determine the mapping relationship based on at least one of following equations:

$$PPRU_{MB}[j]=PRU_{MB}[i], j=0,1,\ldots,K_{MB}-1;$$

$$i=(q(j) \bmod D)*P+\text{floor}(q(j)/D);$$

$$P=\min(K_{MB}, N_1/N_2);$$

$$r(j)=\max(j-(K_{MB} \bmod P)*D, 0);$$

$$q(j)=j+\text{floor}(r(j)/(D-1)); \text{ and}$$

$$D=\text{floor}(K_{MB}/P+1);$$

wherein $PPRU_{MB}$ is the permuted second data sequence, and $PRU_{MB}$ is the first data sequence, $K_{MB}$ is the first number, $N_1$ and $N_2$ are predetermined integer numbers, D is the first parameter, $(K_{MB} \bmod P)*D$ is the second parameter, $r(j)$ is a first intermediate parameter, and $q(j)$ is a second intermediate parameter.

21. The system of claim 19, wherein the permutation device is configured to determine the first parameter, determine the second parameter, and determine the mapping relationship based on at least one of following equations:

$$PPRU_{MB}[j]=PRU_{MB}[i], j=0,1,\ldots,L_{MB}-1;$$

$$i=((q(j) \bmod D)*P+\text{floor}(q(j)/D)*N_2)+(j \bmod N_2);$$

$P=\min(L_{MB}, N_1);$ $r(j)=\max(\text{floor}(j/N_2)-(L_{MB} \bmod P)*D/N_2, 0);$ $q(j)=\text{floor}(j/N_2)+\text{floor}(r(j)/(D-1));$ and $D=\text{floor}(L_{MB}/P+1);$ wherein $PPRU_{MB}$ is the permuted second data sequence, and $PRU_{MB}$ is the first data sequence, $L_{MB}$ is the first number, $N_1$ and $N_2$ are predetermined integer numbers, D is the first parameter, $(L_{MB} \bmod P)*D/N_2$ is the second parameter, $r(j)$ is a first intermediate parameter, and $q(j)$ is a second intermediate parameter.

22. A wireless communication method implemented in a communication system, the method comprising:
receiving a first data sequence at a data receiving interface of the communication system, the first data sequence having a first number of data items;
processing the first data sequence by a data processing device of the communication system to obtain information associated with the first data sequence, the information containing at least one of the first number, a second number, and a sampling spacing, the second number being determined based on the first number;
permuting the first data sequence by a data permutation device of the communication system to generate a permuted second data sequence,
wherein permuting the first data sequence comprises:
determining a first parameter based on at least one of the second number and the sampling spacing;
determining a second parameter based on at least one of the first parameter, the second number, and the sampling spacing; and
determining a mapping relationship between a j-th data item of the permuted second data sequence and an i-th data item of the first data sequence based on at least one of index j, the first parameter, and the second parameter, indexes i and j being integers; and
outputting the permuted second data sequence through an output interface of the communication system,
wherein permuting the first data sequence further comprises:
determining, by the data permutation device, a first intermediate parameter based on at least one of the index j, the first parameter, and the second parameter; and
determining, by the data permutation device, a second intermediate parameter based on at least one of the first intermediate parameter, the index j, and the first parameter, and
wherein determining the first and the second intermediate parameters comprises:
comparing, by the data permutation device, the second parameter with a parameter associated with the index j; and
determining, by the data permutation device, the first and second intermediate parameters based on a result of the comparison.

23. The wireless communication method of claim 22, wherein permuting the first data sequence is based on at least one of following equations:

$PPRU_{MB}[j]=PRU_{MB}[i], j=0, 1, \ldots, L_{MB}-1;$ $i=(q(j) \bmod D)*P+\text{floor}(q(j)/D);$ $P=\min(K_{MB}, N_1/N_2);$ $r(j)=\max(j-(K_{MB} \bmod P)*D, 0);$ $q(j)=j+\text{floor}(r(j)/(D-1));$ and $D=\text{floor}(K_{MB}/P+1);$ wherein $PPRU_{MB}$ is the permuted second data sequence, and $PRU_{MB}$ is the first data sequence, $L_{MB}$ is the first number, $K_{MB}$ is the second number, $K_{MB}=L_{MB}/N_2$, $N_1$ and $N_2$ are predetermined integer numbers, D is the first parameter, $(K_{MB} \bmod P)*D$ is the second parameter, $r(j)$ is a first intermediate parameter, and $q(j)$ is a second intermediate parameter.

24. A miniband permutation method, implemented in a wireless communication system, for mapping a first data sequence to a second data sequence to allocate frequency diverse physical resource units to each frequency partition, the method comprising:
receiving the first data sequence at a data receiving interface of the communication system, the first data sequence having a first number of data items;
processing the first data sequence by a data processing device of the communication system to obtain information associated with the first data sequence, the information containing at least one of the first number, a second number, and a sampling spacing, the second number being determined based on the first number;
permuting the first data sequence by a data permutation device of the communication system to generate the second data sequence,
wherein permuting the first data sequence includes:
determining a first parameter based on at least one of the second number and the sampling spacing;
determining a second parameter based on at least one of the first parameter, the second number, and the sampling spacing; and
determining a mapping relationship between a j-th data item of the second data sequence and an i-th data item of the first data sequence based on at least one of index j, the first parameter, and the second parameter, indexes i and j being integers; and
outputting the second data sequence through an output interface of the communication system,
wherein permuting the first data sequence is based on at least the following equations:

$PPRU_{MB}[j]=PRU_{MB}[i], j=0, 1, \ldots, L_{MB}-1;$ $i=(q(j) \bmod D)*P+\text{floor}(q(j)/D);$ $P=\min(K_{MB}, N_i/N_2);$ $r(j)=\max(j-(K_{MB} \bmod P)*D, 0);$ $q(j)=j+\text{floor}(r(j)/(D-1));$ and $D=\text{floor}(K_{MB}/P+1);$ and wherein $PPRU_{MB}$ is the second data sequence, and $PRU_{MB}$ is the first data sequence, $L_{MB}$ is the first number, $K_{MB}$ is the second number, $K_{MB}=L_{MB}/N_2$, $N_1$ and $N_2$ are predetermined integer numbers, D is the first parameter, $(K_{MB} \bmod P)*D$ is the second parameter, $r(j)$ is a first intermediate parameter, and $q(j)$ is a second intermediate parameter.

* * * * *